(12) United States Patent
Baba

(10) Patent No.: US 6,549,571 B1
(45) Date of Patent: Apr. 15, 2003

(54) CIRCUITRY AND METHOD FOR DUTY MEASUREMENT

(75) Inventor: Mitsuo Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/309,868

(22) Filed: May 11, 1999

(30) Foreign Application Priority Data

May 11, 1998 (JP) .......................................... 10-127963

(51) Int. Cl.[7] .............................................. H04B 17/00
(52) U.S. Cl. ........................... 375/224; 327/33; 327/36
(58) Field of Search ............................... 375/224, 226, 375/238; 327/31, 33, 35, 36, 37

(56) References Cited

U.S. PATENT DOCUMENTS

| | | | |
|---|---|---|---|
| 4,752,927 A | * | 6/1988 | Melling, Jr. .................... 714/3 |
| 5,210,444 A | * | 5/1993 | Johnson ......................... 327/31 |
| 5,367,200 A | | 11/1994 | Leonida |
| 5,598,116 A | * | 1/1997 | Kwon ............................ 327/31 |
| 5,652,668 A | | 7/1997 | Aulet et al. |
| 6,188,738 B1 | * | 2/2001 | Sakamoto et al. ........... 375/371 |
| 6,331,999 B1 | * | 12/2001 | Ducaroir et al. ............. 375/226 |

* cited by examiner

Primary Examiner—Stephen Chin
Assistant Examiner—David B. Lugo
(74) Attorney, Agent, or Firm—Scully, Scott, Murphy & Presser

(57) ABSTRACT

Duty measuring circuitry of the present invention includes a pulse detecting circuit for detecting at least one of a convex pulse width and a concave pulse width included in an input data signal. A duty decision circuit determines whether or not the convex pulse width or the concave pulse width detected is smaller than a preselected value. If the detected pulse width is smaller than the preselected, the duty decision circuit determines that the pulse width is valid, and feeds it to an averaging circuit. The circuitry obviates the need for an exclusive fixed pattern, e.g., ONEs and ZEROs alternating with each other customarily used for the measurement of a duty. In addition, the circuitry is capable of accurately measuring a duty even with a random pattern based on RZ (Return-to-Zero) code or NRZ (Non-Return-to-Zero) code.

52 Claims, 26 Drawing Sheets

Fig.15

| DETECTION OUTPUT SIGNAL | | DECISION OUTPUT SIGNAL (DUTY VALUE %) |
|---|---|---|
| CONVEX PULSE | CONCAVE PULSE | |
| PULSE WIDTH 1 | PULSE WIDTH 15 | 1(12.5%) |
| PULSE WIDTH 2 | PULSE WIDTH 14 | 2(25%) |
| PULSE WIDTH 3 | PULSE WIDTH 13 | 3(37.5%) |
| PULSE WIDTH 4 | PULSE WIDTH 12 | 4(50%) |
| PULSE WIDTH 5 | PULSE WIDTH 11 | 5(62.5%) |
| PULSE WIDTH 6 | PULSE WIDTH 10 | 6(75%) |
| PULSE WIDTH 7 | PULSE WIDTH 9 | 7(87.5%) |
| PULSE WIDTH 8 | PULSE WIDTH 8 | 8(100%) |
| PULSE WIDTH 9 | PULSE WIDTH 7 | 9(112.5%) |
| PULSE WIDTH 10 | PULSE WIDTH 6 | 10(125%) |
| PULSE WIDTH 11 | PULSE WIDTH 5 | 11(137.5%) |
| PULSE WIDTH 12 | PULSE WIDTH 4 | 12(150%) |
| PULSE WIDTH 13 | PULSE WIDTH 3 | 13(162.5%) |
| PULSE WIDTH 14 | PULSE WIDTH 2 | 14(175%) |
| PULSE WIDTH 15 | PULSE WIDTH 1 | 15(187.5%) |

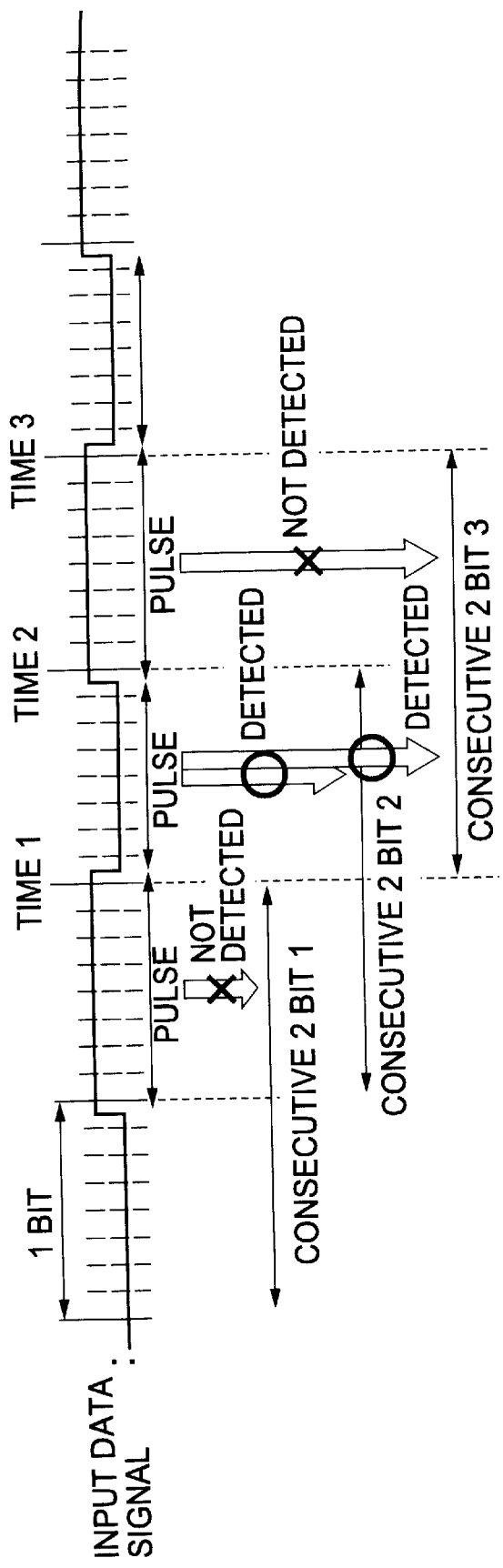

E:f(X)=X,X/2

F:f(X)=X/2,X/4

C:f(X)=X+45° ,X/2,X-45°

H:f(X)=X/2+22.5° ,X/4,X/2-22.5°

CIRCUITRY AND METHOD FOR DUTY MEASUREMENT

BACKGROUND OF THE INVENTION

The present invention relates to circuitry and a method for duty measurement and more particularly to circuitry and a method of the type sampling an input signal at N consecutive points to thereby measure the duty of the input signal.

Modern data communication services are required to have various kinds of capabilities in order to meet the increasing demand for data communications. To implement higher speed, broader range communication, among others, there have been proposed, e.g., an ISDN (Integrated Services Digital Network) basically featuring a transmission rate of 64 kilobits per second and a B (Broadband)-ISDN capable of sending a 100 times greater amount of data than ISDN. For higher speed, broader range communication, a network using optical fibers is essential in addition to the conventional network using copper cables.

However, the problem with a PDS (Passive Double Star) system or similar subscriber system is that an optoelectrical converter for converting an optical signal to an electric signal distorts the duty of the signal. A current trend is therefore toward the measurement of the duty of an input signal, giving up the ideal of reducing the distortion of a duty. By measuring the duty, it is possible to accurately identify data even when the duty of a data signal is distorted.

Conventional circuitry for the measurement of a duty has some problems left unsolved, as follows. An input signal must include an exclusive field in which a fixed pattern, e.g., a pattern of ONEs and ZEROs alternating with each other is arranged. Moreover, the position where the fixed pattern is present must be clearly detected in the input signal. Consequently, the generation and analysis of the input signal are complicated and render the construction of the optoelectric converter and that of the optical transmission system sophisticated.

SUMMARY OF THE INVENTION

It is therefore an object of the present invention to provide circuitry and a method for duty measurement capable of accurately measuring the duty of an input signal without resorting to an exclusive fixed pattern and even with a random pattern based on RZ (Return-to-Zero) code or NRZ (Non-Return-to-Zero) code.

In accordance with the present invention, in circuitry for measuring the duty of an input signal, at least one of a peak pulse width and a trough pulse width of the input signal is detected and is determined, when smaller than a preselected value, to be valid for the calculation of a duty value.

Also, in accordance with the present invention, a data identification system includes the above circuitry and a data identifying circuit for identifying, based on a duty output from the circuitry, data of the data signal and outputting the data as an identified data signal.

Further, in accordance with the present invention, a method of measuring the duty of an input signal includes a detecting step for detecting at least one of a convex pulse width and a concave pulse width, and a validating step for validating, if the convex pulse width or the concave pulse width detected is smaller than a preselected value, the convex pulse width or the concave pulse width for the calculation of a duty value.

Moreover, in accordance with the present invention, a method of identifying data includes the above method of measuring a duty of an input data signal, and a data identifying step for identifying, based on a duty output by the method, data of the data signal and outputting the data as an identified data signal.

In addition, in accordance with the present invention, a method of reproducing data includes a PLL (Phase Locked Loop) step for separating a clock signal from the data signal to thereby output a separated clock signal, the above method of measuring a duty of an input, a phase shifting step for shifting, based on the duty value output by the phase of the separated clock signal to thereby output a phase-shifted clock signal, and a flip-flop step for sampling the data signal in synchronism with the phase-shifted clock signal to thereby output a reproduced data signal.

BRIEF DESCRIPTION OF THE DRAWINGS

The above and other objects, features and advantages of the present invention will become apparent from the following detailed description when taken with the accompanying drawings in which:

FIG. 15 is a graph showing a specific relation between a pulse width and a duty ratio available with the illustrative embodiments;

FIG. 17 demonstrates how the sampling circuit samples M consecutive bits of an input data signal;

DETAILED DESCRIPTION OF THE PREFERRED EMBODIMENTS

Figure 24:
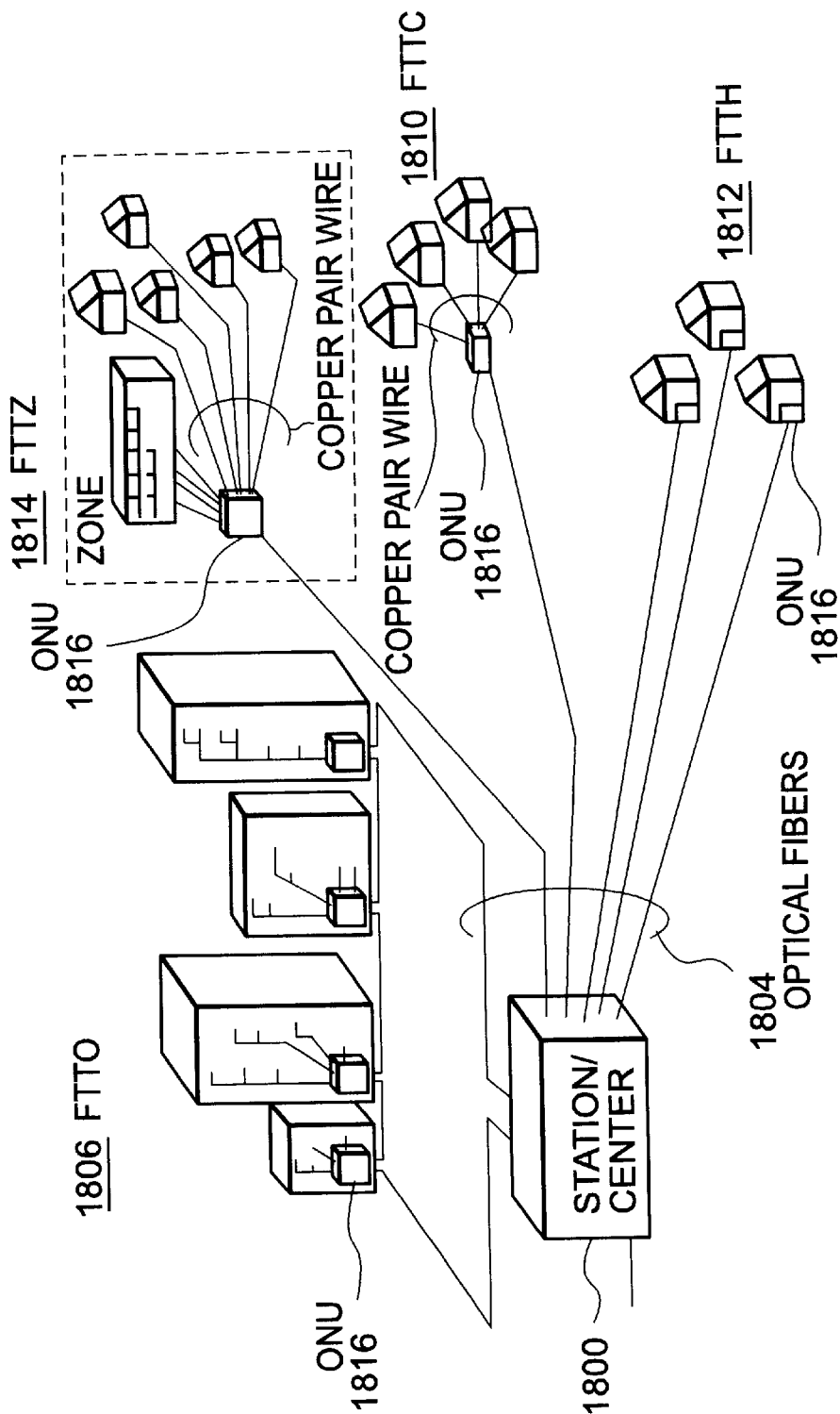
FIG. 24 is a view showing a specific conventional optical communication system to which the present invention is applicable.

To better understand the present invention, brief reference will be made to a conventional communication system using optical fibers, shown in FIG. 24. As shown, mainly to reduce the cost for laying optical fibers, optical fibers are laid in various configurations including FTTO (Fiber To The Office) 1806, FTTZ (Fiber To The Zone) 1814, FTTC (Fiber To The Curb) 1810, and FTTH 1812. FTTO 1806 has optical fibers laid to offices. FTTZ 1814 is directed toward multiplex transmission and has optical fibers laid to a zone where telephones are densely installed. FTTC 1810 has optical fibers laid up to an optoelectric conversion unit (ONU) 1816 located on, e.g., the roadside, and pair wires extending from the ONU 1816 to four to five subscribers. FTTH 1812 has optical fibers each being laid up to a particular home.

A station/center 1800 sends information in the form of optical signals via optical fibers 1804. To allow the information to be actually used, the above configurations 1806–1812 each needs the ONU 1816 for converting an optical signal to an electric signal.

Figure 25:
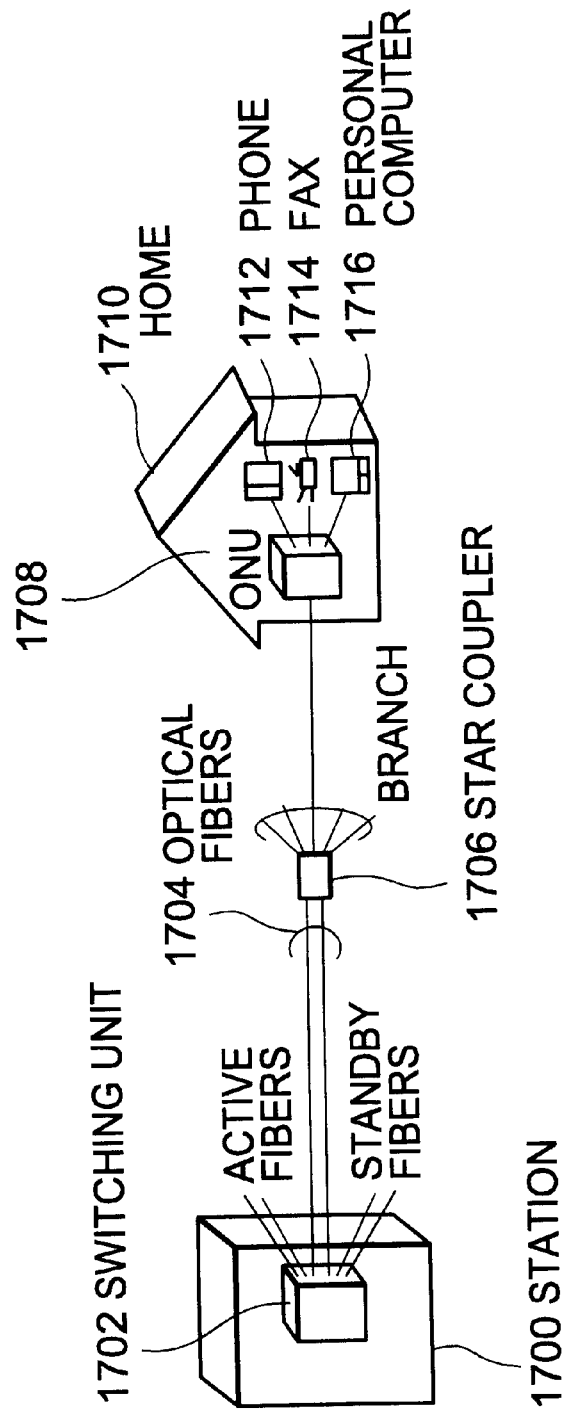
FIG. 25 is a view showing a specific FTTH (Fiber To The Home) configuration included in the system of FIG. 24.

FIG. 25 shows FTTH 1812 more specifically. The system configuration shown in FIG. 25 is generally referred to as a PDS system. As shown, a station 1700 includes a switching unit 1702. An active optical fiber and a standby optical fiber, collectively labeled 1704, are connected to the switching unit 1702. The two optical fibers 1704 are laid mainly for a maintenance and operation purpose.

An optical signal propagated through either one of the optical fibers 1704 is branched by a start coupler 1706. One of the branched optical signals is delivered to an ONU 1708 situated in a home 1710 for transforming the optical signal to an electric signal. In the home 1710, the electric signal is fed to, e.g., a telephone 1712, a facsimile apparatus 1714 or a personal computer 1716. This provides the user with high speed, broadband data communication.

The problem with the PDS or similar subscriber system is that the ONU 1708 distorts the duty of an input signal, as stated earlier. To solve this problem, there has been proposed to measure the duty of an input signal for thereby promoting error-free data identification even when the duty of the input signal is distorted. This kind of scheme, however, cannot measure a duty unless the input signal includes an extra field storing a fixed pattern, e.g., ONEs and ZEROs alternating with each other.

This, coupled with the fact that the position of the fixed pattern in the input signal must be accurately detected, renders the generation and analysis of the input signal sophisticated.

Figure 26:
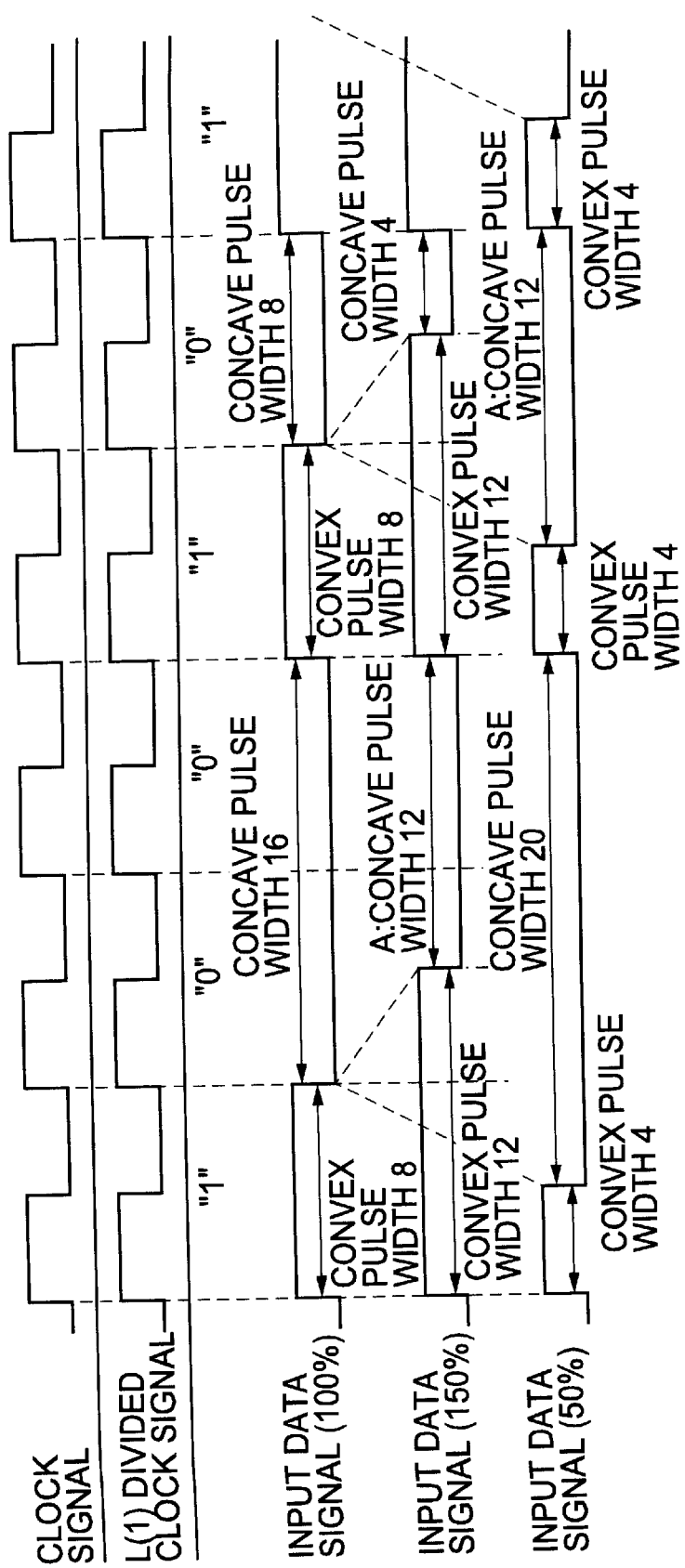
FIG. 26 is a chart showing specific pulse widths and distorted duties (%).

FIG. 26 shows a relation between the distortion of a duty and the resulting pulse width. Specifically, FIG. 26 shows a case wherein the duty of an input data signal is distorted by ±50%, i.e., a +50% data signal, a +150% data signal, and a +100% data signal. As shown, when the distortion is +150%, a pulse having a convex pulse (peak, or high portion of a pulse) width 12 is detected out of data "1001". When the distortion is +50%, a pulse with a concave pulse (trough, or low portion of a pulse) width 12 is also detected out of data "101". In this manner, the duty varies in accordance with the condition of data when distorted.

Preferred embodiments of the duty measuring circuitry in accordance with the present invention will be described hereinafter.

First Embodiment

Figure 1:
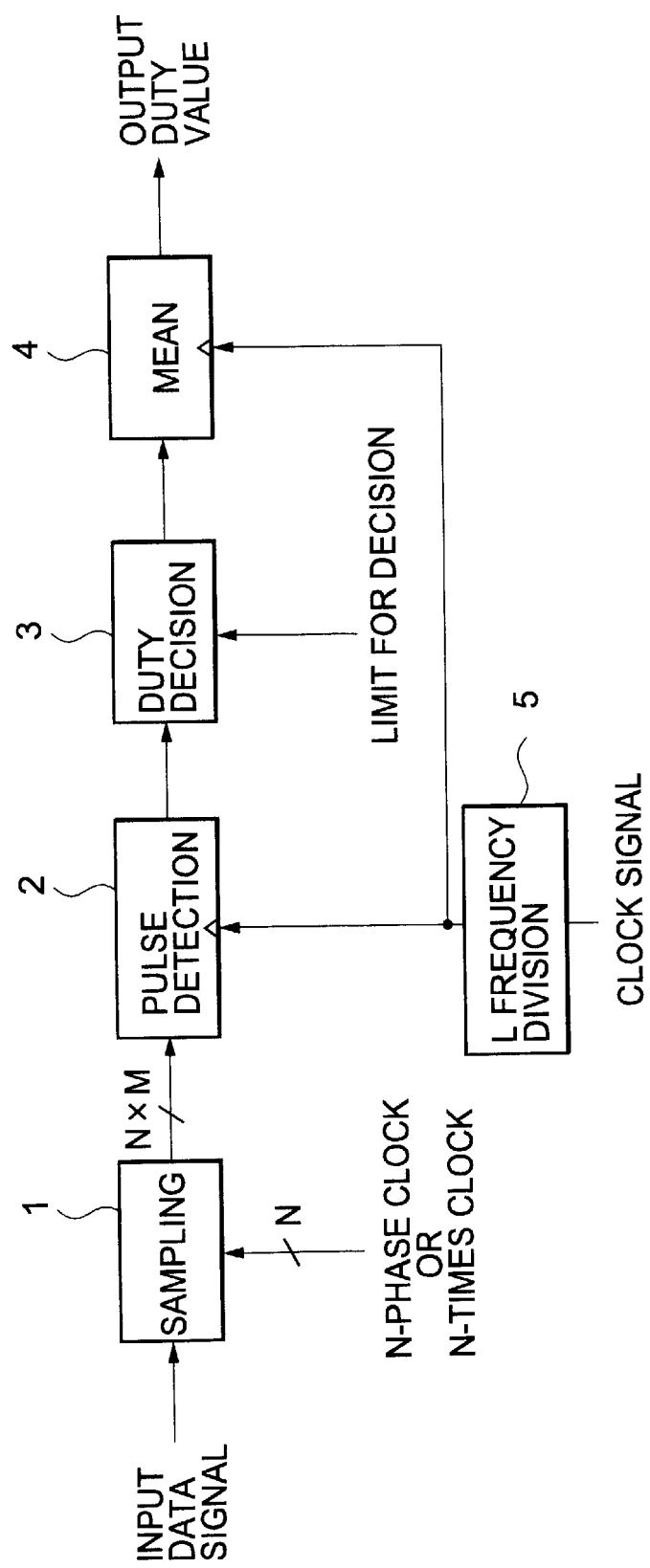
FIG. 1 is a block diagram schematically showing a first embodiment of the duty measuring circuitry in accordance with the present invention.

Referring to FIG. 1, duty measuring circuitry embodying the present invention includes a sampling 1 for sampling an input data signal. The output of the sampling 1 is applied to a pulse detection 2. A duty decision 3 determines the duty of a pulse width detected by the pulse detection 2. A mean 4 produces a mean of duty values based on pulse widths determined to be valid by the duty decision 3. An L frequency division 5 divides a preselected clock signal by L (integer greater than 1 inclusive) and delivers the divided clock signal to the pulse detection 2 and mean 4.

The operation of the illustrative embodiment will be described hereinafter. Briefly, the input data signal and N-phase clock signals or an N-times clock signal (N being an integer greater than 2 inclusive) are input to the circuitry. The N-phase clock signals have the same frequency as the input data signal and has phases sequentially shifted by 360°/N. The N-times clock signal has a frequency N times as high as the frequency of the input data signal. The circuitry determines the duties of the input data signal and outputs a mean duty value.

Specifically, the sampling 1 digitally samples the input data signal with the N-phase clock signals or the N-times clock signal and thereby outputs N×M sampled signals; M is representative of M consecutive bits of the input data signal and is an integer greater than 1 inclusive.

In the following description, N representative of the number of phases of the N-phase clock signal or the multiplier of the N-times clock signal is assumed to be 8. Also, M representative of the bit width of the input data sampled by the sampling 1 is assumed to be 2 while the divisor L of the L frequency division 5 is assumed to be 1. Of course, N, M and L may be any desired numbers other than 8, 2 and 1, respectively.

Figure 13:
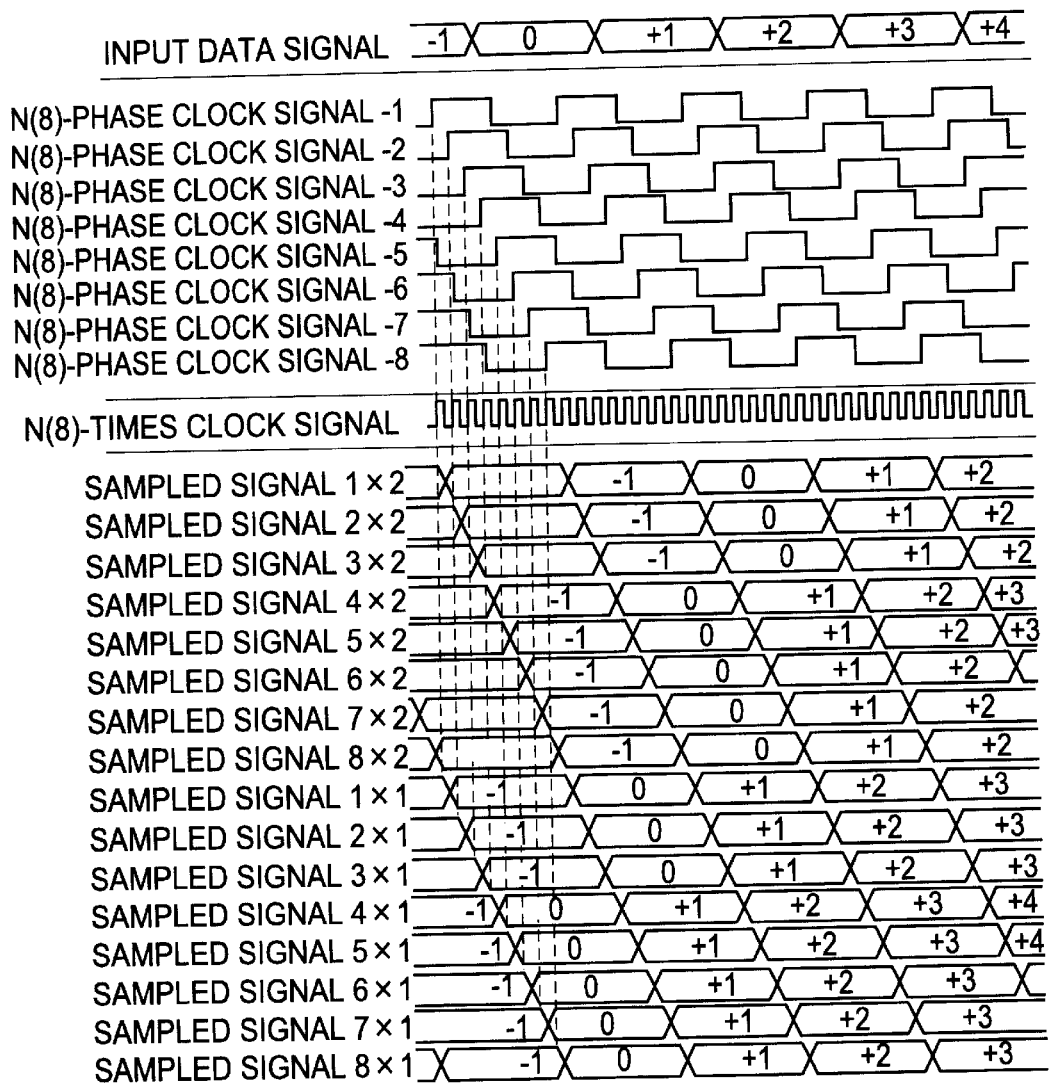
FIG. 13 is a timing chart showing a specific operation of a sampling circuit included in any one of the illustrative embodiments for outputting sampled signals.

First, reference will be made to FIG. 13 for describing the operation of the sampling 1. In FIG. 13, the input data signal is serially numbered "−1", "0", "+1", "+2", "+3" and "+4" from the oldest bit to the newest bit with respect to time. As shown, the N(8)-phase clock signals 1–8 are sequentially shifted in phase at the intervals of one-eighth of one clock period. The N(8)-times clock signal has a frequency eight times as high as the frequency of the input data signal.

The sampling 1 samples the input data signal at the positive-going edges of the N(8)-phase clock signals 1–8 or those of the N(8)-times clock signal. Because M is assumed to be 2, the sampling 1 outputs sixteen sampled signals 1×1 through 8×2 in total. Specifically, the sampling 1 produces eight sampled signals 1×2 through 8×2 by shifting, or delaying, eight sampled signals 1×1 through 8×1 by one period of the N(8)-phase clock signals or by the N(8)-times clock signal.

Figure 16A:
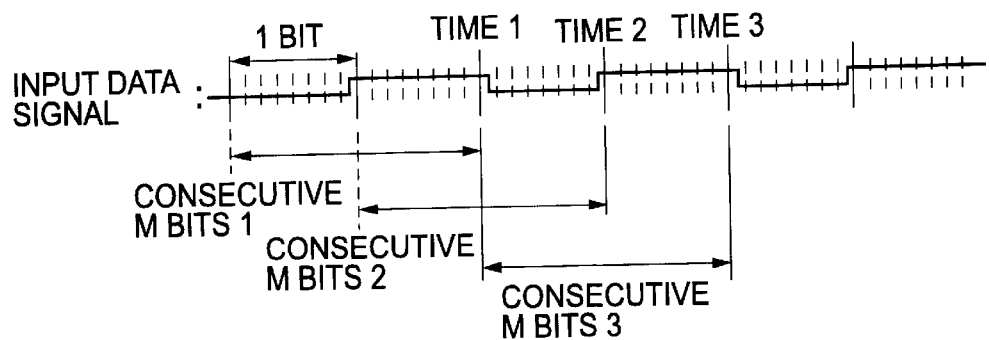
FIGS. 16A and 16B demonstrate how the sampling circuit included in any one of the illustrative embodiments shifts sampled signals.

The N×M sampled signals output from the sampling 1 will be described more specifically with reference to FIGS. 16A and 16B. It is to be noted that M consecutive bits of the input data signal to be output from the sampling 1 refer to M consecutive bits of an input data signal having some continuous bits. Further, as shown in FIG. 16A, the M consecutive bits refer to M bits counted retroactively from each of times ①, ②, ③ and so forth which are the operating points of the circuitry shown in FIG. 1. One bit of the input data signal is representative of one period of the N-phase clock signals or N periods of the N-times clock signal.

Figure 16B:
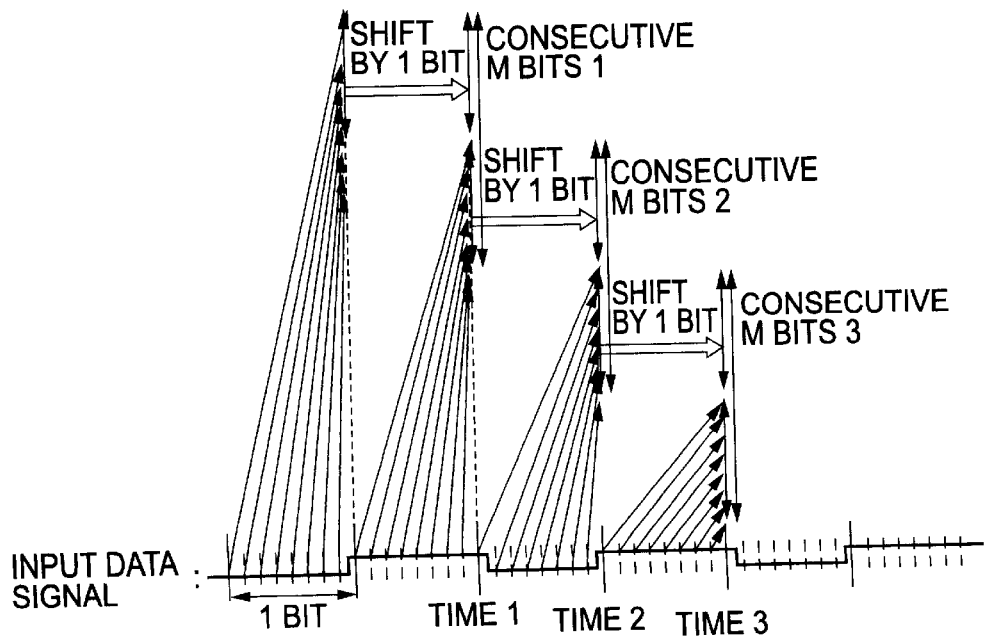

The input data signal shown in FIG. 16A and 16B are assumed to be sampled by the eight-phase clock signals or the 8-times clock signal by way of example.

M bits of consecutive sampled data will be described with reference to FIG. 16B. As shown, N different input data signals sampled by the eight-phase clock signals or the eight-times clock signal are bodily shifted by zero bit in the dime domain, shifted by one bit in the time domain, shifted by two bits in the time domain, . . . , and shifted by M-1 bits in the time domain. As a result, N×M different signals are produced.

Specifically, as shown in FIG. 16B, assume that M is 2, and that the time ① is the operation point of the circuitry. Then, N sampled signals derived from the input data signal appeared up to a time one bit before the time ① are the signals shifted by zero bit and are therefore directly output. Next, N sampled signals derived from the data signal appeared during the interval between one bit before the time ① and two bits before the time ① are the signals to be shifted by one bit and are therefore shifted (delayed) by, e.g., a shift register and then output. In this manner, when M is 2, N×2 sampled signals are output.

Figure 18:
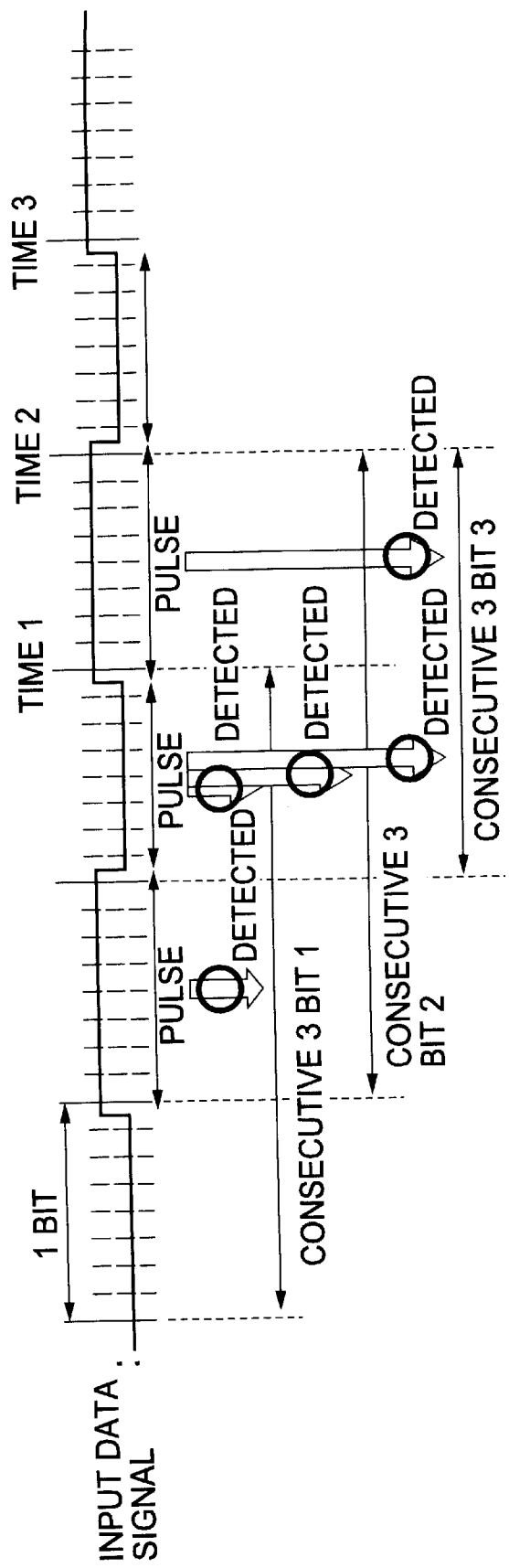
FIG. 18 demonstrates how the sampling circuit samples M consecutive bits of an input data signal.
Figure 19A:
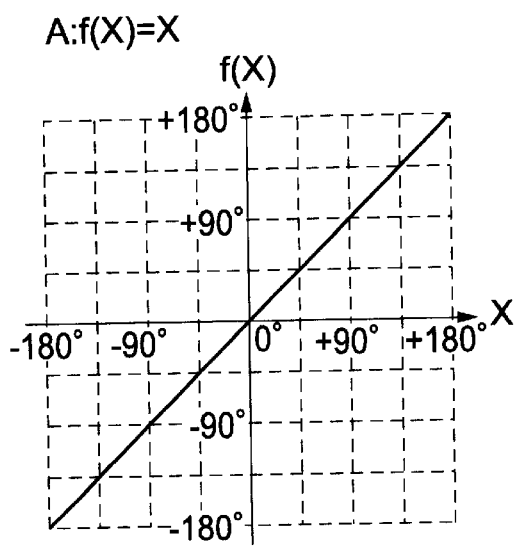
FIGS. 19A to 19D, 20A to 20D, 21A and 21B are graphs each showing a particular weighting coefficient applicable to the present invention.
Figure 19B:
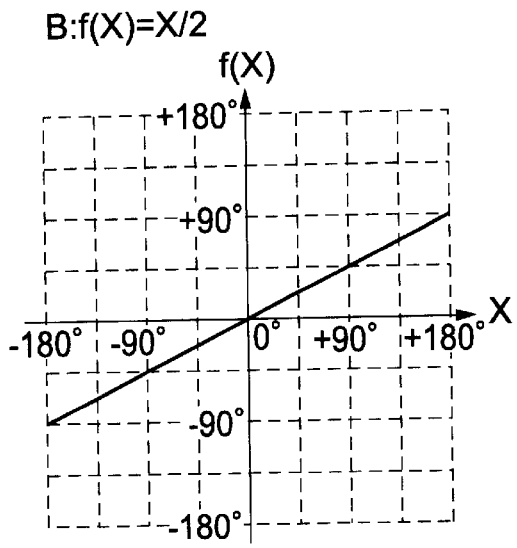
Figure 19C:
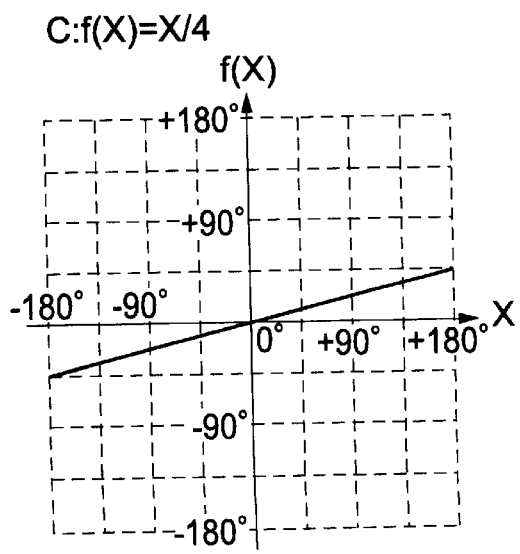
Figure 19D:
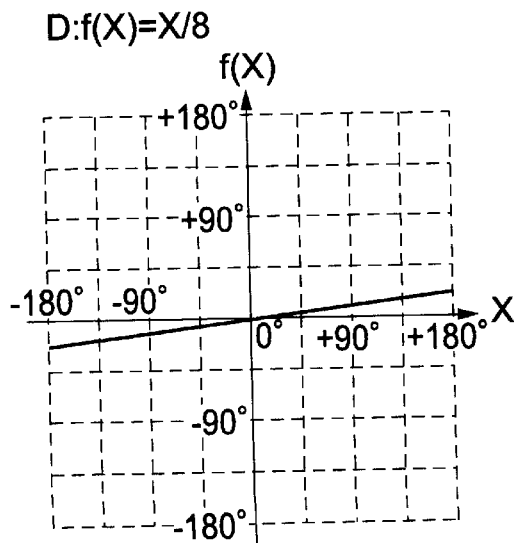

Reference will be made to FIGS. 17 and 18 for describing why the illustrative embodiment samples M consecutive bits of the input data signal. FIGS. 17 and 18 respectively show a case wherein two consecutive bits of the input data signal are sampled and a case wherein three consecutive bits of the input data are sampled by way of example. As shown in FIG. 17, if M is only 1 or 2, then circuitry fails to detect some pulses. More specifically, when two consecutive bits of the input data signal appeared up to the time ② are sampled, a concave pulse can be detected. However, if two consecutive bits appeared up to the time ③ are sampled, then no pulses, i.e., concavity or convexity is detected because the duty value of the input data signal is not 100%.

As shown in FIG. 18, if three consecutive bits of the input signal are sampled, then the concavity or convexity of the input data signal can be surely detected on the basis of three bits preceding any one of the times ①, ② and ③. That is, considering that M×2 is not a necessary sufficient condition, the illustrative allows M to be any desired integer greater than 1 inclusive.

The pulse detection 2 and duty decision 3 shown in FIG. 1 operate as follows. The sampling 1 also shown in FIG. 1 feeds N×M sampled signals to the pulse detection 2. The pulse detection 3 detects convex pulse information and concave pulse information out of the input sampled signals in synchronism with the divided frequency signal output from the L frequency division 5, FIG. 1. The pulse detection 3 delivers the above information, including pulse width information, to the duty decision 3.

When the output signal of the pulse detection 2 has a pulse width greater than a limit for decision, the duty decision 3 determines that the signal with the above pulse width is invalid. When the output signal of the pulse detection 2 has a pulse width smaller than the limit, the duty decision 3 determines it to be valid, calculates a duty value corresponding to the pulse width, and feeds the duty value to the mean 4, FIG. 1.

Figure 14:
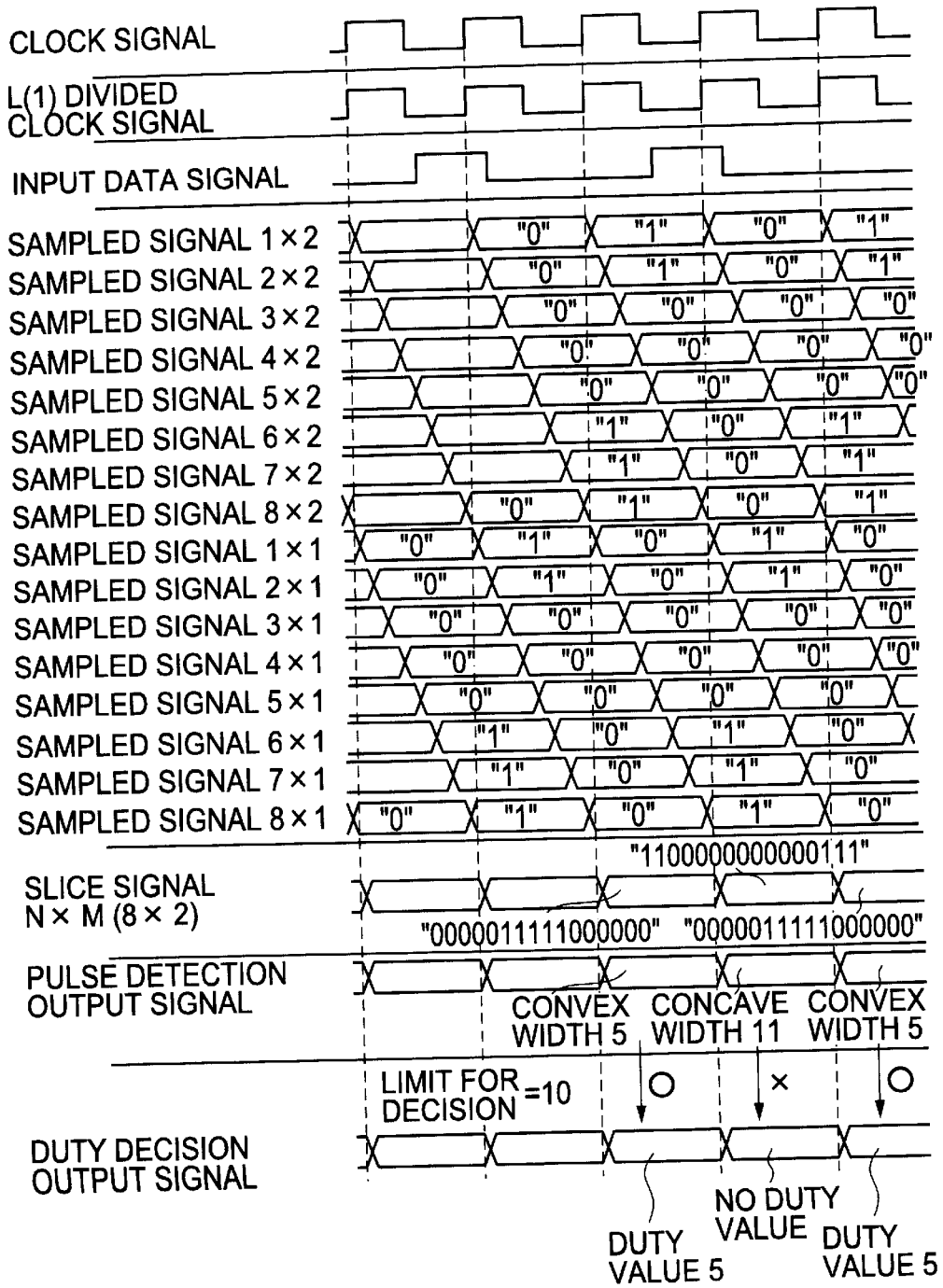
FIG. 14 is a timing chart showing specific operations of a pulse detecting circuit, a duty decision circuit and an L frequency division circuit included in any one of the illustrative embodiments.

Referring to FIG. 14, the operation of the pulse detection 2, duty decision 3 and L frequency division 5 will be described. As shown, the L frequency division 5 divides the input clock signal by L at the positive-going edges of the clock signal to thereby generate the divided clock signal. For example, if L is 1, then the frequency division 5 outputs an L (1) divided signal identical with the input clock signal, as shown in FIG. 14.

Why the L frequency division 5 divides the clock signal before delivering it to the pulse detection 2 and mean 4 is as follows. First, assume that the frequency division 5 divides the input clock signal by a great divisor L, i.e., outputs a divided signal with a high frequency. Then, when the input data signal has a high rate, the overall processing time of the pulse detection 2, duty decision 3 and mean 4 can be prevented from exceeding one period of the clock signal. On the other hand, if the divisor L is relatively small (L<1), i.e., if the frequency of the divided clock signal is low, then there can be saved power to be consumed by the pulse detection 2, duty decision 3, and mean 4.

As stated above and as shown in FIG. 1, the clock signal can be divided by L in matching relation to the application of the duty measuring circuitry. This is successful to further enhance the convenience of the duty measuring circuit. When L is small, the circuitry detects pulses intermittently and may therefore fail to detect all the pulses. This, however, can be made up for by increasing the number of bits M. It is to be noted that so increasing M is not necessary when it comes to applications not needing rapid tuning or rapid tracking.

Referring again to FIG. 14, the input data signal is sampled to form the sampled signals 1×1 through 8×2 each having a particular value representative of the concavity or the convexity of the data signal. The pulse detection 2 takes in the sampled signals 1×1 through 8×2 in synchronism with the positive-going edges of the L(1) divided clock signal and produces N×M (8×2) bits of slice signals. The N×M (8×2) bits of slice signals are identical with M (2) bits of the input data signal rearranged in the direction of bits.

Subsequently, the pulse detection 2 detects concave pulses " . . . 10 . . . 01 . . . " and convex pulses " . . . 01 . . . 10 . . . ", measures the pulse width of each of the concave and convex pulses, and outputs concavity and convexity information and pulse widths as a pulse detection output. In the specific operation shown in FIG. 14, the pulse detection 2 detects a convex pulse width 5, a concave pulse width 11, and a convex pulse width 5. When the pulse detection 2 detects no concave or convex pulse, it does not produce the pulse detection output. When N is 8, a pulse width 8 is representative of a distortion-free state.

The duty decision 3 compares the pulse width of the pulse detection output and the pulse width represented by the limit for decision. If the former is greater than the latter, the duty decision 3 determines it invalid; if otherwise, the duty decision 3 determines it valid. The duty decision 3 calculates a valid duty value based on the valid pulse width and outputs the calculated valid duty value as a decision output signal.

In the specific procedure shown in FIG. 14, the pulse width represented by the limit is assumed to be 10. It follows that the convex pulse width 5 is invalid while the concave pulse width 11 is valid. The pulse width 10 is, of course, illustrative and may be replaced with any other suitable value.

In the illustrative embodiment, the pulse detection 2 outputs a single pulse because M is assumed to be 2. The other embodiments to be described later assume that M is greater than 3 inclusive, and therefore cause their pulse detecting sections to sometimes output two or more pulses.

The mean 4, FIG. 1, produces a difference between the decision output signal and the previous output duty value stored as a mean value, weights the difference, adds the resulting weighted difference to the previous output duty value, and outputs the resulting sum in synchronism with the divided frequency clock signal.

Figure 2:
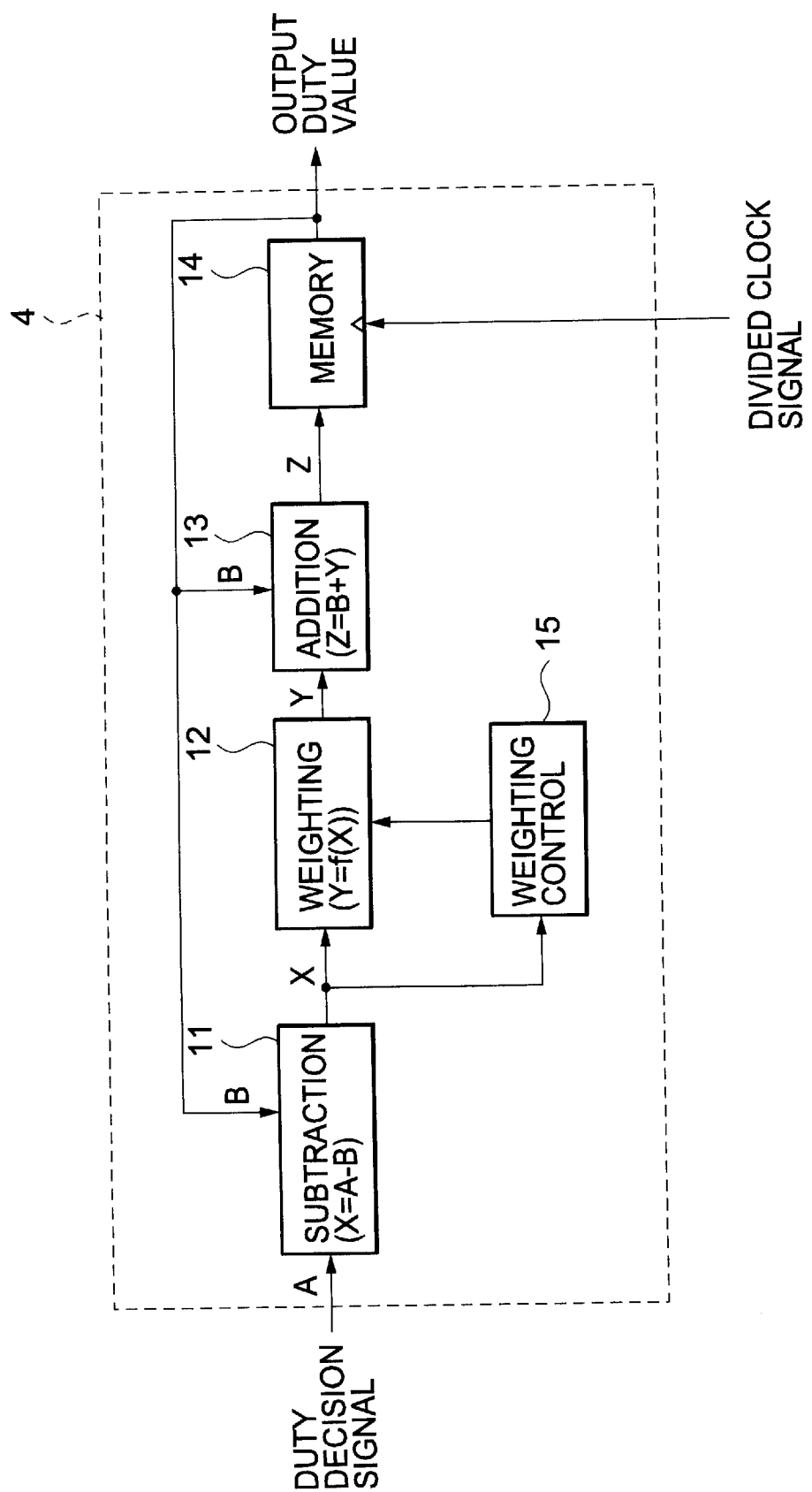
FIG. 2 is a schematic block diagram showing a specific configuration of a mean circuit included in the first embodiment.

FIG. 2 shows a specific configuration of the mean 4. As shown, the mean 4 is made up of a subtraction 11, a weighting 12, an addition 13, a memory 14, and a weight control 15. The subtraction 11 produces a difference X=A−B where A and B are representative of the decision output signal and the output duty value read out of the memory 14. The weighting 12 weights the difference X output from the subtraction 12 by a weighting function Y=f(X) to thereby produce a weighted output signal Y.

The weight control 15 sets a weighting function f(X) matching with the difference X in the weighting 12 and controls the weighting 12. The addition 13 adds the duty value B output from the memory 14 to the weighted output signal Y and feeds the resulting sum signal Z to the memory 14. The memory 14 stores the sum signal Z and outputs it in synchronism with the divided clock signal as an output duty value.

The mean 4 with the above configuration sets a particular weighting function f(X) for each of a case wherein the difference X is relatively great and a case wherein it is relatively small. The former case is expected to occur during tuning, e.g., just after the start-up of the duty measuring circuit or when a burst signal is received. The latter case is expected to occur when the operation tracks steady slow changes to occur after tuning. It is therefore possible to strongly suppress jitter and other high-speed rapid changes while implementing rapid tuning.

Reference will be made to FIGS. 19A to 19D, 20A to 20D, 21A and 21B for describing the weighting function f(X) set by the weight control 15. FIGS. 19–21 each shows particular relations between the phase difference X of the weighting function f(X) and the calculated value Y.

It is to be noted that while X has been described as being a difference between duty values, X shown in FIGS. 19–21 is representative of a phase difference corresponding to a duty value. For example, when the input signal data is sampled in synchronism with the eight-phase clock signals or the eight-times clock signal, a shift of the duty value by 1 causes the phase to vary by 450. When N of the N-phase clock signals or the N-times clock signals is other than 8, a shift of the duty value by 1 will cause the phase to vary by an angle other than 45°.

A relation between the pulse width and the duty value and relating also to the above relation between the duty value and the phase difference will be described with reference to FIG. 15. Specifically, FIG. 15 shows a relation between the widths of convex pulses, the widths of concave pulses, and decision output signals including parenthesized duty values (%).

For example, when a convex pulse has a width of 1, a concave pulse has a width of 15 while the duty value is 1. For a convex pulse having a width of 5, a convex pulse has a width of 11 while the duty value is 5. A duty value is set in accordance with the widths of such pulses. Because the illustrative embodiment samples the input data signal with the eight-phase clock signals or the eight-times clock signal, the duty is free from distortions (duty value of 8; 100%) when the above pulse widths are 8. In the specific relation shown in FIG. 15, when the duty value is shifted by 1, the phase is shifted by 45° because 360°/8 is 45°.

FIGS. 19A to 19D, 20A to 20D, 21A and 21B are graphs showing specific weighting coefficients f(X). Specifically, FIG. 19 shows a graph (A) corresponding to Y=f(X)=X, a graph (B) corresponding to Y=f(X)=(½)X, a graph (C) corresponding to Y=f(X)=(¼)X, and a graph (D) corresponding to Y=f(X)=(⅛)X. The graph (FIG. 19 A) is representative of a case wherein the difference X calculated by the subtraction 11, FIG. 2, is directly output. Although the result of this calculation is not a weighted mean, such a calculation will also be referred to as averaging including weighting for the sake of illustration.

The graph (FIG. 19 B) shows a case wherein the difference X is divided by 2 and then output without regard to the size of the difference X. The graph (FIG. 19 C) shows a case wherein the difference X is divided by 4 and then output without regard to the size of the difference X. The graph (FIG. 19 D) shows a case wherein the difference X is divided by 8 and then output without regard to the size of the difference X.

FIG. 20 shows a graph (A) representative of a function given by Y=f(X)=(½)X when the phase difference X lies in the range of −90°≦X≦+90° or given by Y=f(X)=X when it lies in the range of −90°<X or X>+90°. A graph (B) is representative of a function given by Y=f(X)=(¼)X when the difference X lies in the range of −90°≦X≦+90° or given by Y=f(X)=(½)X when it lies in the range of −90°<X or X>+90°. A graph (C) is representative of a function given by Y=f(X)=(½)X when the phase difference X lies in the range of −90° C.≦X≦+90°, given by Y=f(X)=X+45° when it lies in the range of −90<X, or given by Y=f(X)=−45° when it lies in the range of X>+90°. Further, a graph (D) is representative of a function given by Y=f(X)=(¼)X when the phase difference X lies in the range of −90°≦X≦+90°, given by Y=f(X)=(½)X+22.5° when it lies in the range of −90°<X, or given by Y=f(X)=(½)X−22.5° when it lies in the range of X>+90°.

Figure 20A:
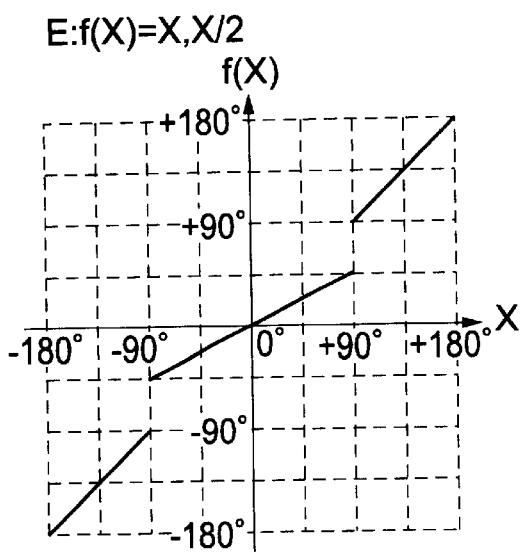
Figure 20B:
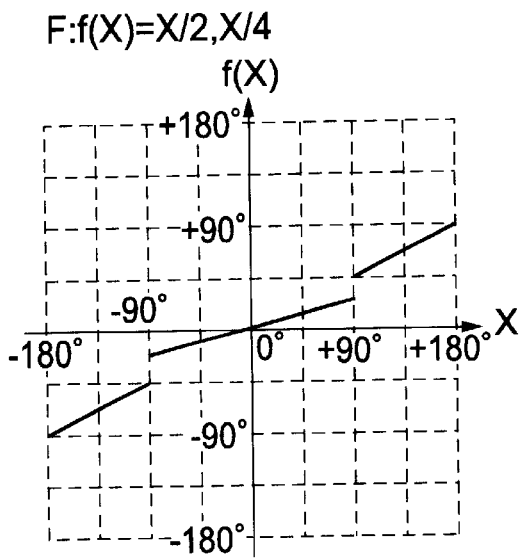
Figure 20C:
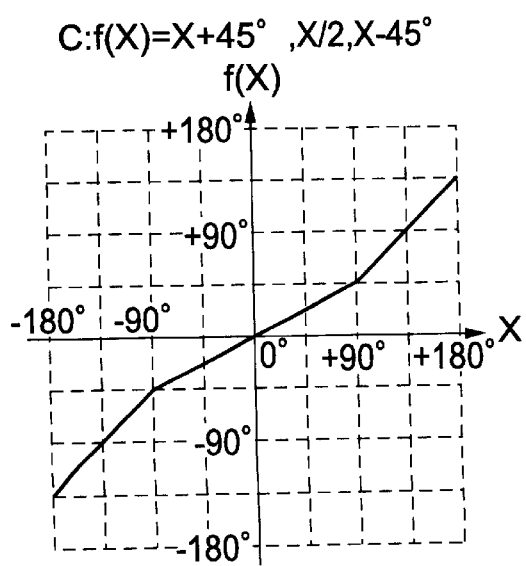
Figure 20D:
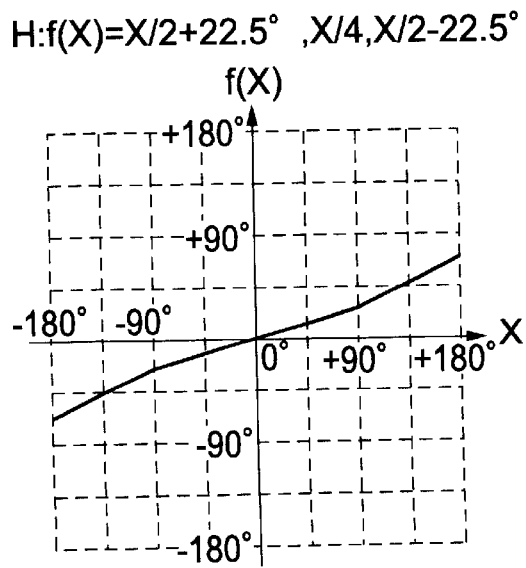

In the graph of FIG. 20A, the weighting function f(X) is varied in accordance with the size of the difference X. Particularly, when the difference is great, weighting can be effected such that the resulting value is small. In the graph of FIG. 20B, the weighting function f(X) is also varied in accordance with the size of the difference X; weighting is effected such that the resulting value is small when the difference X is small or such that the resulting value is great when the difference X is great. The graph of FIG. 20C is similar to the graph (FIG. 20A) except that a preselected value is added to the function in order to obviate discontinuity. The graph of FIG. 20D is similar to the graph (FIG. 20B) except that a preselected value is added to the function in order to obviate discontinuity.

Figure 21A:
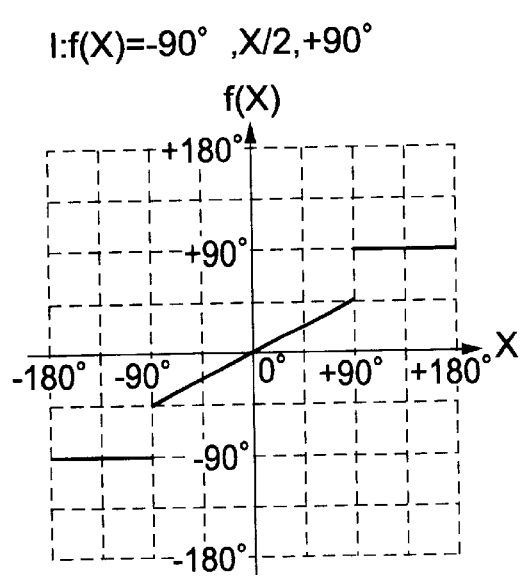
Figure 21B:
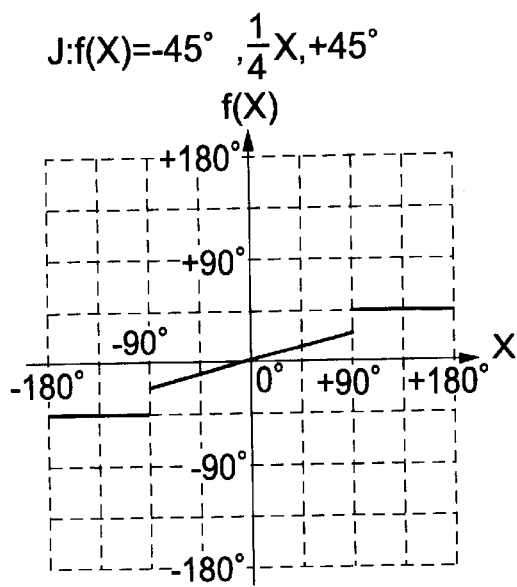

FIG. 21A shows a specific graph representative of a function given by Y=f(X)=(½)X when the phase difference X lies in the range of −90°≦X≦+90°, given by Y=f(X)=−9° when it lies in the range of −90°<X, or given by Y=f(X)=+ 90° when it lies in the range of +90°>X. Also shown in FIG. 21B is a specific graph representative of a function given by Y=f(X)=(¼)X when the phase difference X lies in the range of −90°≦X≦+90°, given by Y=f(X)=−45° when it lies in the range of −90°≦X, or given by f(X)=+45° When it lies in the range of +90°>X.

In the graph of FIG. 21A, when the difference X exceeds a preselected value, the weighted value is maintained constant. The graph of FIG. 21B is similar to the graph of FIG. 21A except that the slope of the function and the preselected value are varied.

It should be noted that the weighting functions f(X) described above with reference to FIGS. 19–21 are only illustrative and may be replaced with any other suitable weighting functions.

In FIGS. 20 and 21, the transition points of the function Y=f(X) are assumed to be ±90°, i.e., the function varies when the difference X is ±90°. This is also only illustrative. The difference X varies over a range of from −180° to +180° (−50% to +50%). When the input data signal is sampled by the eight-phase clock signals or the eight-times clock signal, the difference X is discrete, i.e., any one of −180° (−50%), −135° (−37.5%), −90° (−25%), −45° (−12.5%), 0° (0%), +45° (12.5%), +90° (25%), and +135° (+37.5%). Considering an error of +45° particular to the sampling using the above clock signal or signals, it is preferable to select about ±90° (±25%) as a range of the size of the phase difference X. In practice, however, the transition points of the function Y=f(X) should be preselected in consideration of the variation of the detected pulse width ascribable to the jitter and other phase variation factors of the input data signal.

The illustrative embodiment varies the function in accordance with the difference X. Alternatively, the function may be varied on the basis of, e.g., a period of time elapsed since the input of a start signal, as will be described later in relation to other embodiments. Specifically, the functions f(X) shown in the graphs of FIG. 19A–19D may be varied in accordance with the above period of time. For example, when the period of time elapsed is short and requires rapid tuning, the function Y=f (X)=X shown in the graph (FIG. 19A) may be used. As the period of time elapses increases, the function Y=f(X)=(⅛)X shown in the graph (FIG. 19D) may be used. This is also successful to strongly suppress jitter and other high-speed phase variation factors while insuring rapid tuning.

As stated above, the mean 4 produces a difference between the input decision output signal and the previous duty value or mean value, weights the difference, adds the weighted difference to the previous duty value, and outputs the resulting sum as a new duty value in synchronism with the clock signal divided by L(1).

The circuitry of FIG. 1, therefore, does not directly take in the concave and convex pulse widths output from the pulse detection 2 as duty values and average them, but averages only the information determined to have pulse widths smaller than the preselected limit by the duty decision 3. This allows the circuitry to select only "101 (concave pulses)" and "010 (convex pulses)" out of the input data signal as duty values, i.e., prevents it from erroneously selecting two-bit pulses including "1001" and "0110". It follows that duties can be measured without resorting to an exclusive field for a fixed pattern, e.g., "1" and "0" alternating with each other. In addition, the duty values of the input data signal can be accurately measured even with a random pattern based on RZ code or NRZ code.

Further, the mean 4 with the configuration shown in FIG. 2 is capable of switching the weighting function f(X) in accordance with the phase difference X. Specifically, when the difference X is great, as expected just after the start-up of the circuitry of FIG. 1 or when a burst signal is received, the mean 4 selects f(X)=(½)×X. When the difference X is small, as expected when the operation tracks steady slow changes to occur after tuning, the mean 4 selects f(X)=(¼)×X. It is therefore possible to maintain rapid tuning (when the difference X is great) and to strongly suppress jitter and other high-speed phase variation factors (when the difference X is small).

Second Embodiment

Figure 3:
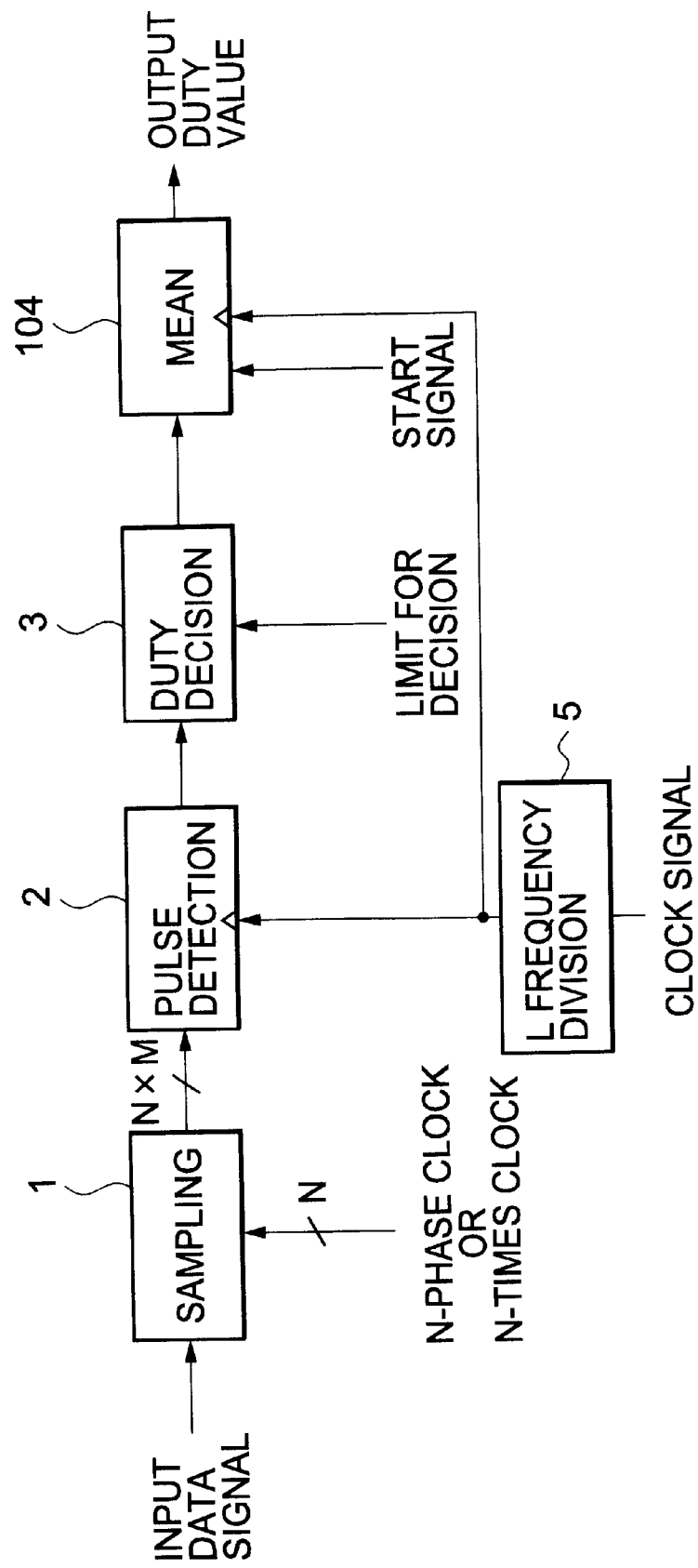
FIG. 3 is a schematic block diagram showing a second embodiment of the present invention.

Referring to FIG. 3, a second embodiment of the present invention will be described. In FIG. 3, structural elements identical with the structural elements of FIG. 1 are designated by like reference numerals and will not be described in detail in order to avoid redundancy. As shown, the circuitry of FIG. 3 is identical with the circuitry of FIG. 1 except that a mean 104 is substituted for the mean 4 and receives a start signal.

Figure 4:
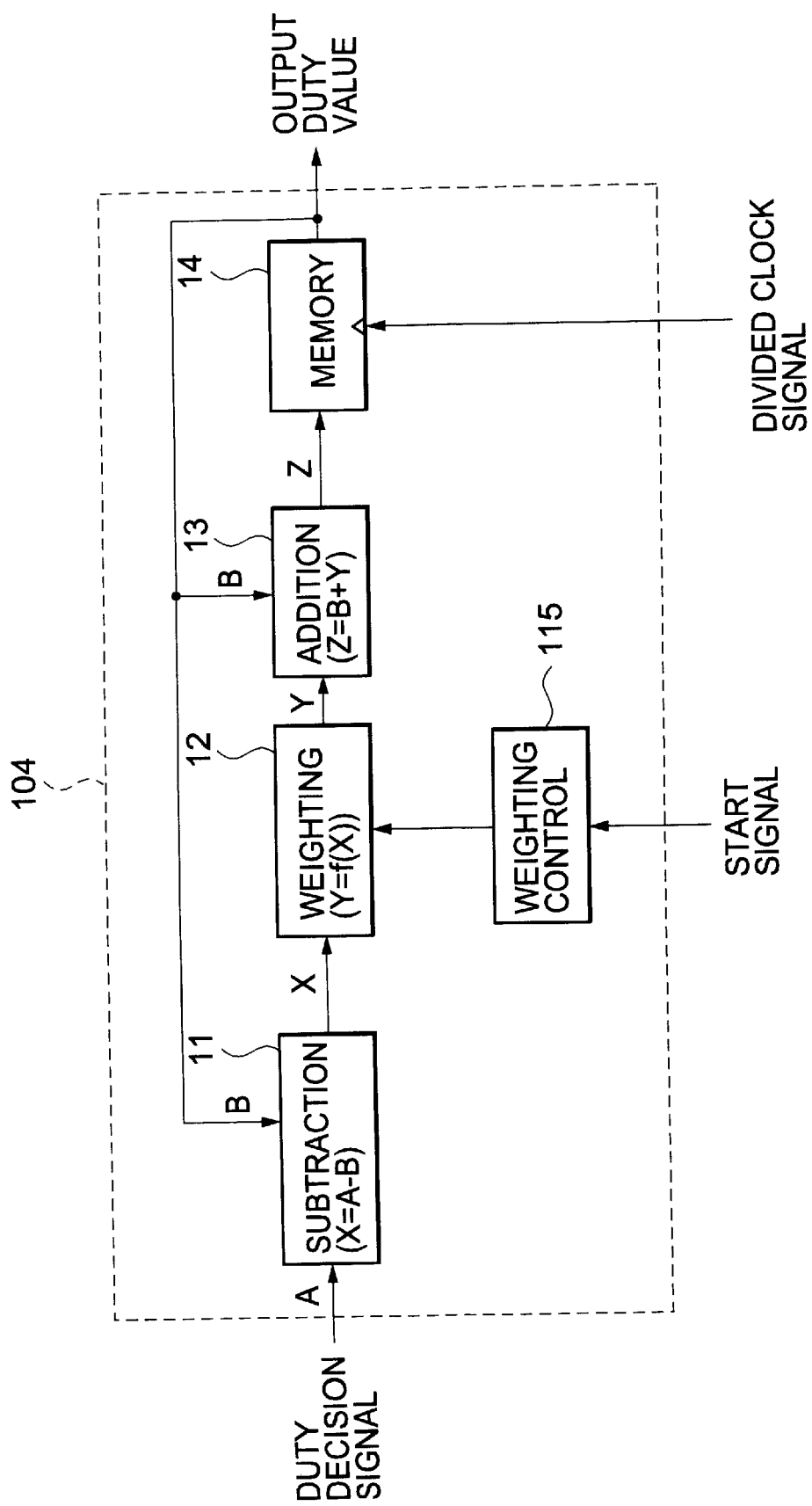
FIG. 4 is a schematic block diagram showing a specific configuration of a mean circuit included in the second embodiment.

FIG. 4 shows a specific configuration of the mean 104. In FIG. 4, structural elements identical with the structural elements of FIG. 2 are designated by like reference numerals and will not be described in detail. As shown, the mean 104 includes a weighting control 115 in place of the weighting control 15, FIG. 4. A start signal is input to the weighting control 115 in place of the difference X. In this configuration, the weighting control 115 controls the weighting 12 on the basis of the start signal. The start signal should preferably be a signal representative of, e.g., the head of a burst data signal.

In the configuration shown in FIG. 4, the weighting control 115 does not control the weighting function f(X) on the basis of the difference X, but varies it in the time domain on the basis of the start signal. For the weighting function f(X), use may be made of the other functions shown in FIGS. 19–21 by way of example. For example, the circuitry may use the function f(X)=(½)×X for ten bits at the time of tuning, i.e., since the input of the start signal and then use the function f(X)=(¼)×X.

Third Embodiment

Figure 5:
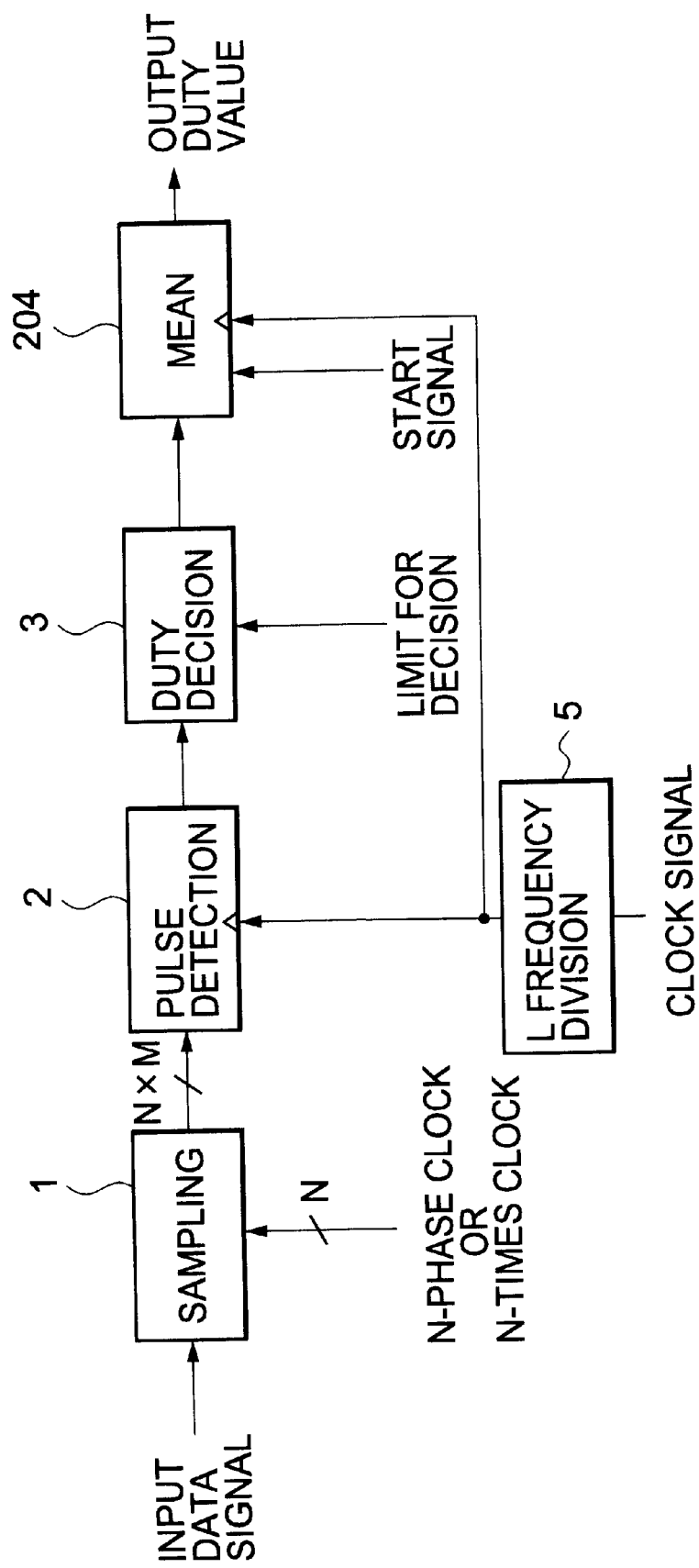
FIG. 5 is a schematic block diagram showing a third embodiment of the present invention.

FIG. 5 shows a third embodiment of the present invention. In FIG. 5, structural elements identical with the structural elements shown in FIG. 1 are designated by like reference numerals and will not be described in detail in order to avoid redundancy. As shown, this embodiment is identical with the first embodiment except that a start signal is input to a mean 204.

Figure 6:
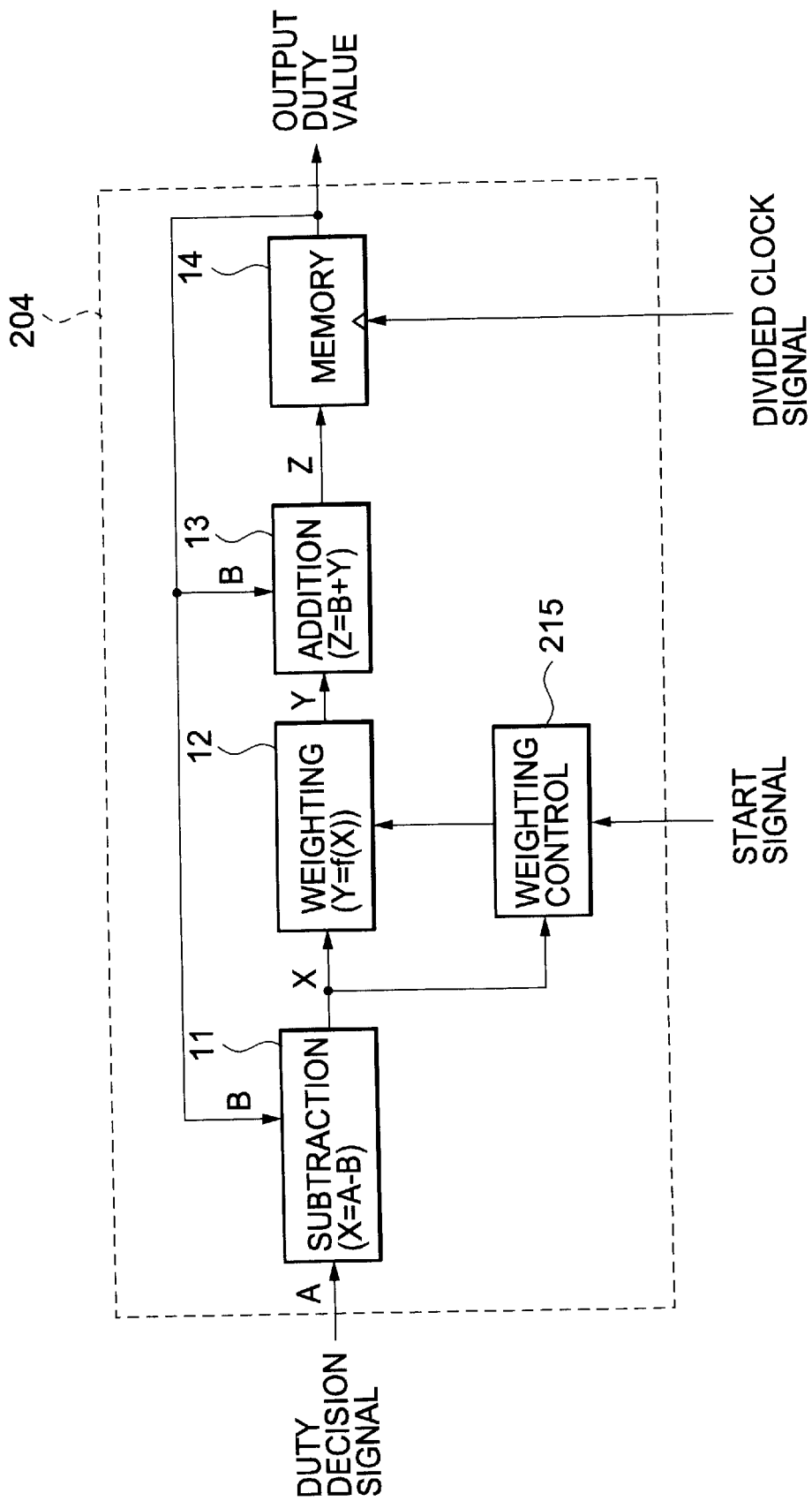
FIG. 6 is a schematic block diagram showing a mean circuit included in the third embodiment.

FIG. 6 shows a specific configuration of the above mean 204. In FIG. 2, structural elements identical with the structural elements shown in FIG. 2 are designated by like reference numerals and will not be described in detail in order to avoid redundancy. As shown, the mean 204 differs from the mean 4, FIG. 2, in that the difference X and start signal are input to the weighting control 215. The weighting control 215 therefore controls the weighting 12, e.g., the weighting function f(X) on the basis of both of the difference X and start signal.

Again, for the weighting function f (X), use may be made of the other functions shown in FIGS. 19–21 by way of example. For example, the circuitry may use the function f(X)=(½)×X for ten bits at the time of tuning if the difference X is great and then use f(X)=(½)×X if the difference X is great or f(X)=(¼)×X if it is small.

A fourth embodiment to a sixth embodiment to be described hereinafter each include a pulse detecting section constructed to detect a plurality of pulses.

Fourth Embodiment

Figure 7:
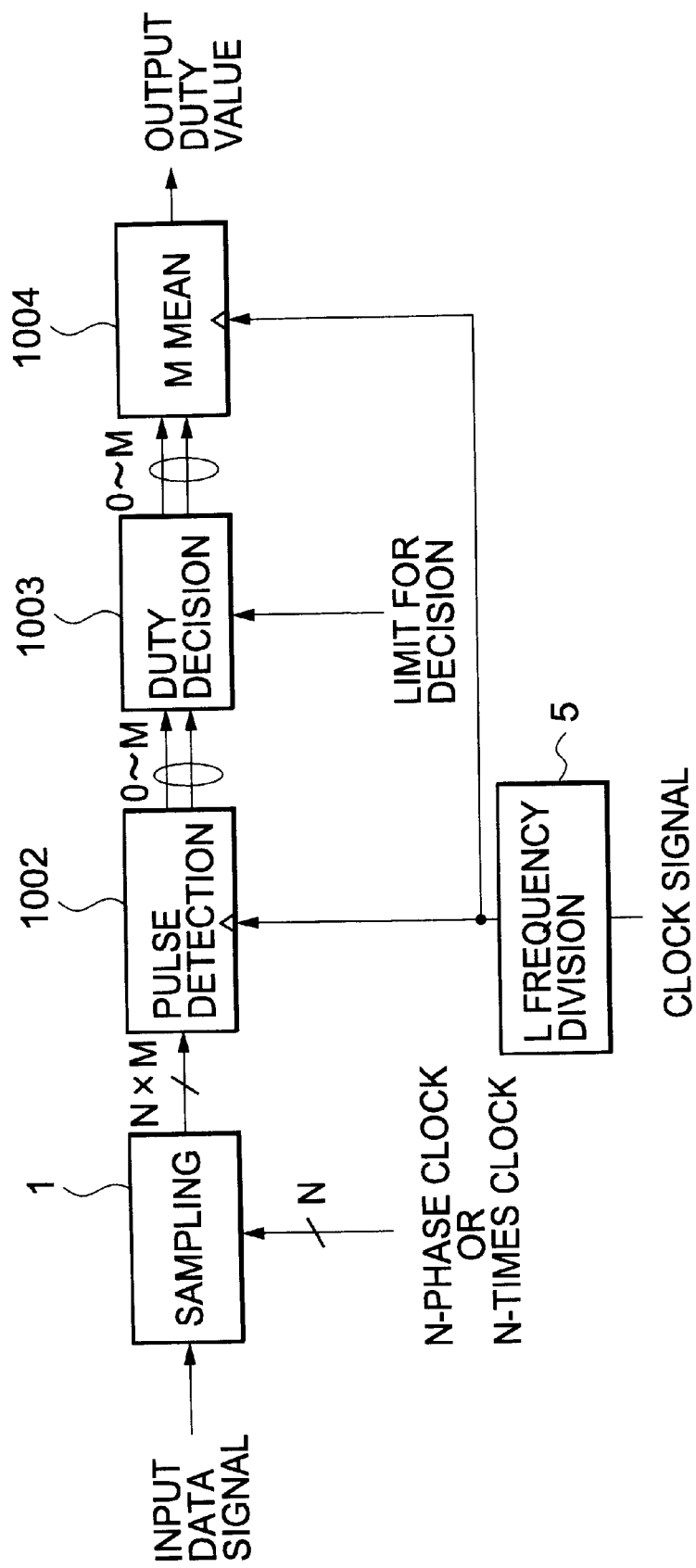
FIG. 7 is a schematic block diagram showing a fourth embodiment of the present invention.

Reference will be made to FIG. 7 for describing a fourth embodiment of the present invention. In FIG. 7, structural elements identical with the structural elements shown in FIG. 1 are designated by like reference numerals and will not be described in detail in order to avoid redundancy. As shown, the circuitry includes the sampling 1 and L frequency division 5 operating in exactly the same manner as in the first embodiment. A pulse detection 1002 receives from the sampling 1 M bits of sampled signals derived from the input data signal. The pulse detection 1002 detects pulses the number of which lies in the range of from zero to M, and delivers zero to M detection signals to a duty decision 1003.

Assume that the zero to M detection signals output from the pulse detection 1002 each have a pulse width greater than one represented by a preselected limit for decision. Then, the duty decision 1003 determines that the M detection signals are invalid. If the pulse widths of the detection signals each are smaller than the pulse width represented by the limit, the duty decision 1003 determines that their duty value is valid, and delivers the zero to M detection signals to an M mean 1004 in the form of M' ($0 \leq M' \leq M$) duty decision signals. The M mean 1004 averages the M' (zero to M) duty decision signals in synchronism with the positive-going edges of the L divided frequency clock to thereby output a mean duty value.

Figure 8:
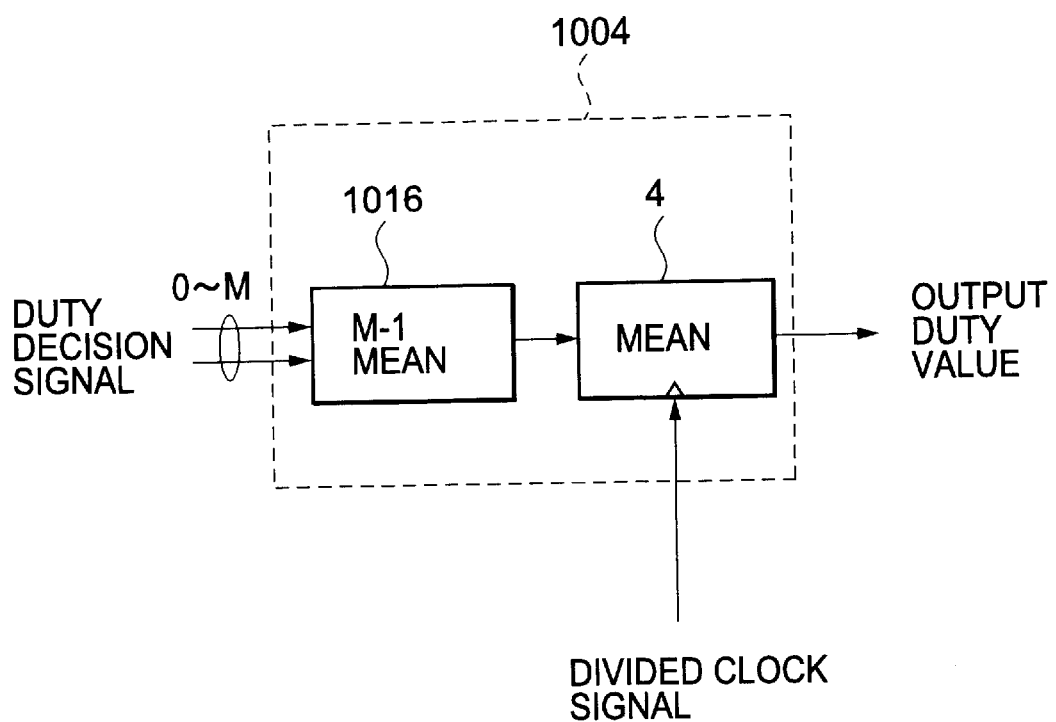
FIG. 8 is a schematic block diagram showing a specific configuration of an M mean circuit included in the fourth embodiment.

FIG. 8 shows a specific configuration of the M mean 1004. As shown, the M mean 1004 has an M−1 mean 1016 and the mean 4 identical with the mean 4 of FIG. 2. It is to be noted that "M−1" is representative of a procedure for averaging the M or less duty decision signals so as to convert them to a single duty decision signal.

Specifically, the M−1 mean 1016 receives the zero to M duty decision signals, averages them, and delivers the resulting mean to the mean 4. The mean 4 is capable of varying the weighting function f(X) in accordance with the difference X in exactly the same manner as described with reference to FIG. 2. The difference is that the mean of the zero to M duty decision signals is input to the mean 4 in place of the signal A shown in FIG. 2.

Fifth Embodiment

Figure 9:
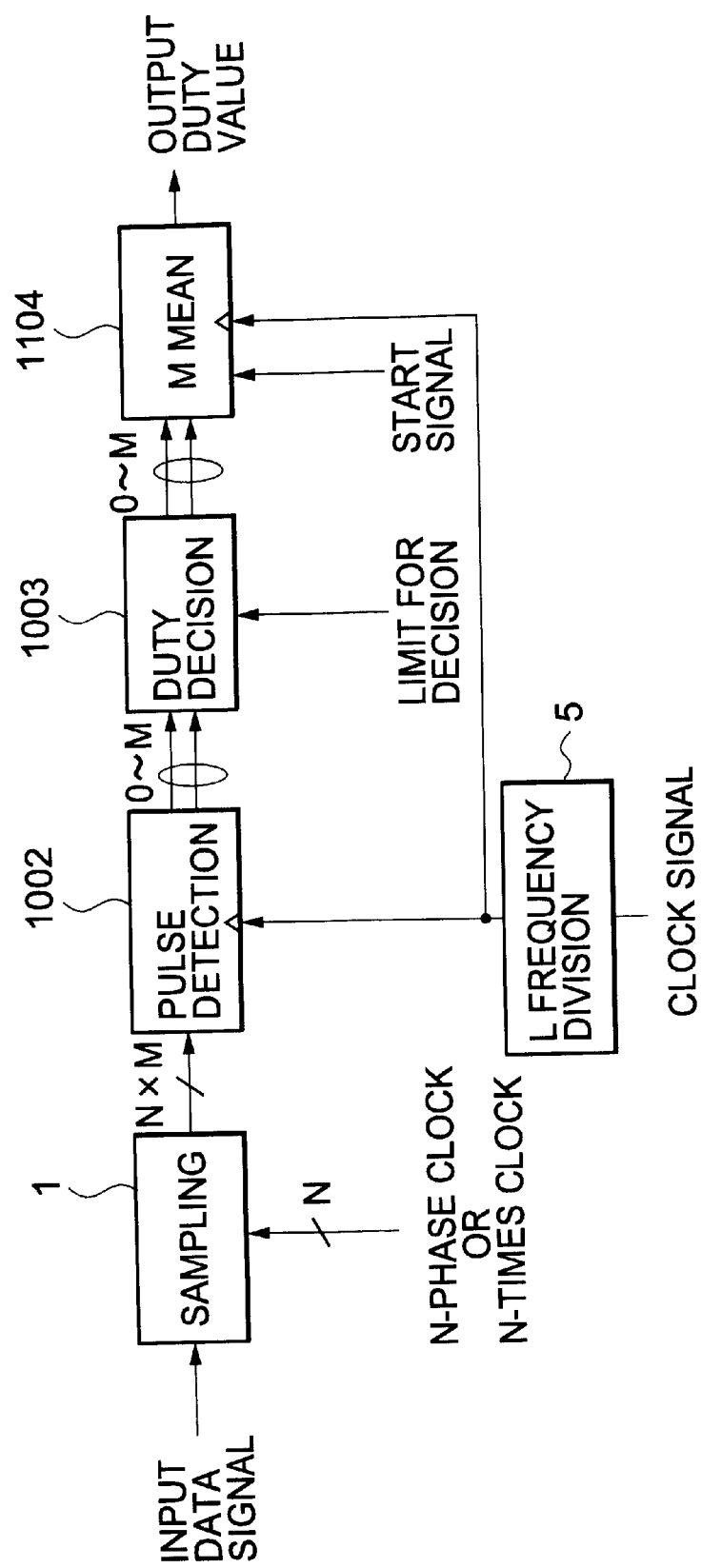
FIG. 9 is a schematic block diagram showing a fifth embodiment of the present invention.

FIG. 9 shows a fifth embodiment of the present invention. In FIG. 9, structural elements identical with the structural elements shown in FIG. 7 are designated by like reference numerals and will not be described in detail in order to avoid redundancy. As shown, the circuitry includes the sampling 1, L frequency division 5, pulse detection 1002 and duty detection 1003 operating in exactly the same manner as described with reference to FIG. 7.

In FIG. 9, an M mean 1104 receives the zero to M duty decision signals from the pulse detection 1002 and receives the start signal. The M mean 1104 outputs an averaged duty value at a timing synchronous to the positive-going edge of the L divided frequency clock.

Figure 10:
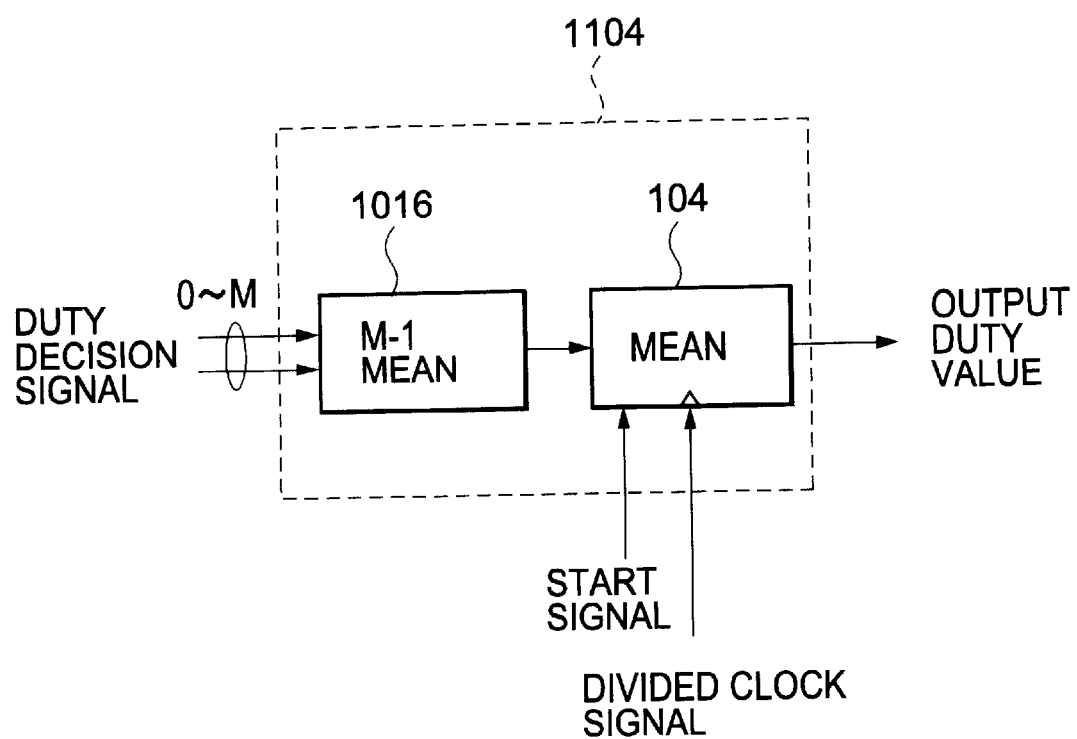
FIG. 10 is a schematic block diagram showing an M mean circuit included in the fifth embodiment.

FIG. 10 shows a specific configuration of the M mean 1104. As shown, the M mean 1104 is made up of the M−1 mean 1016 and mean 104. The M−1 mean 1016 and mean 104 are respectively identical in operation with the M−1 mean of FIG. 8 and the mean of FIG. 3. Specifically, the weighting control, not shown, is capable of varying the weighting function f(X) in accordance with a period of time elapsed by using the start signal. The difference is that the mean of the zero to M duty decision signals is input to the mean 104 in place of the signal A.

Sixth Embodiment

Figure 11:
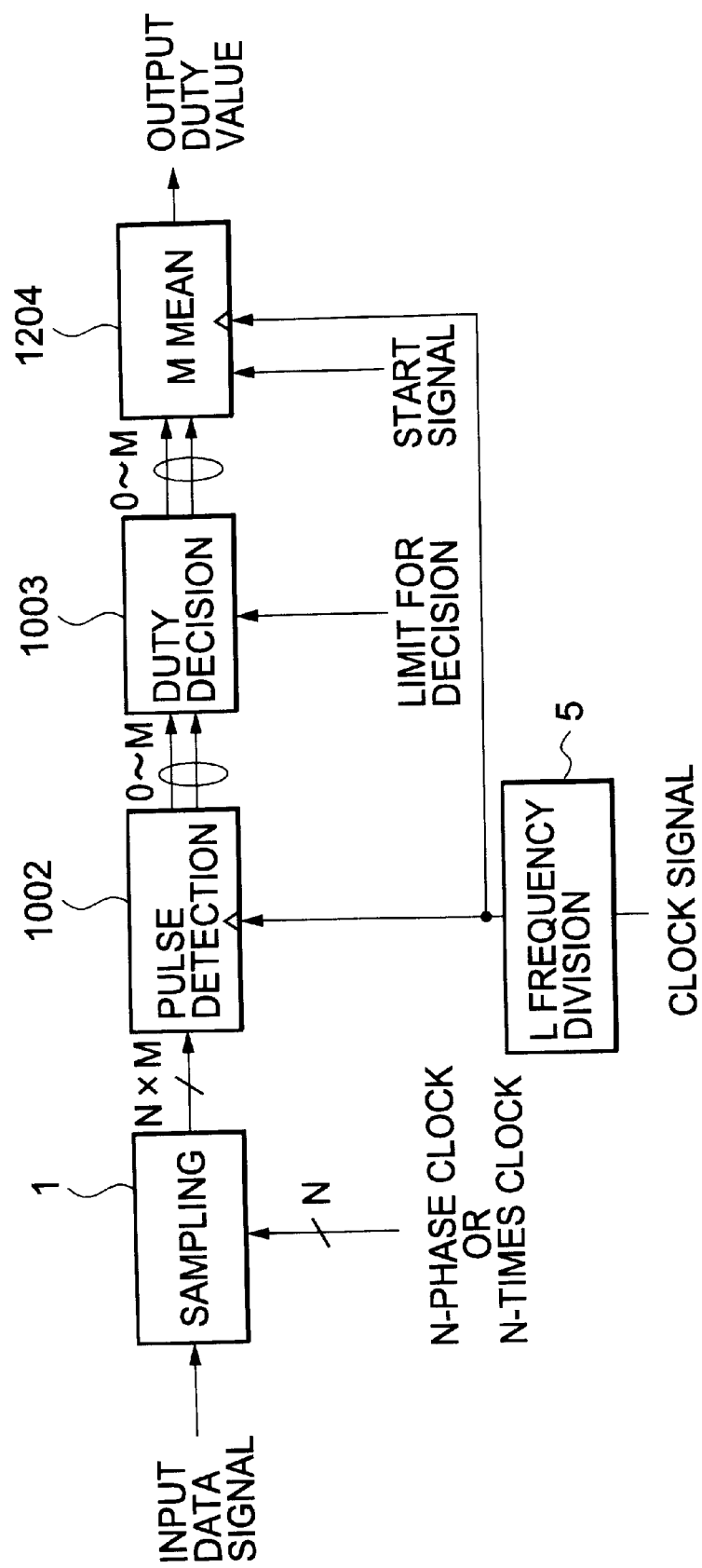
FIG. 11 is a schematic block diagram showing a sixth embodiment of the present invention.

A sixth embodiment of the present invention will be described with reference to FIG. 11. In FIG. 11, structural elements identical with the structural elements shown in FIG. 7 are designated by like reference numerals. As shown, the circuitry includes the sampling 1, L frequency division 5, pulse detection 1002 and duty decision 1003 operating in exactly the same manner as described with reference to FIG. 7. An M mean 1204 receives the zero to M duty decision signals from the duty decision 1003 and receives the start signal. The M mean 1204 outputs a mean duty value at a timing synchronous to the positive-going edge of the L divided frequency clock.

Figure 12:
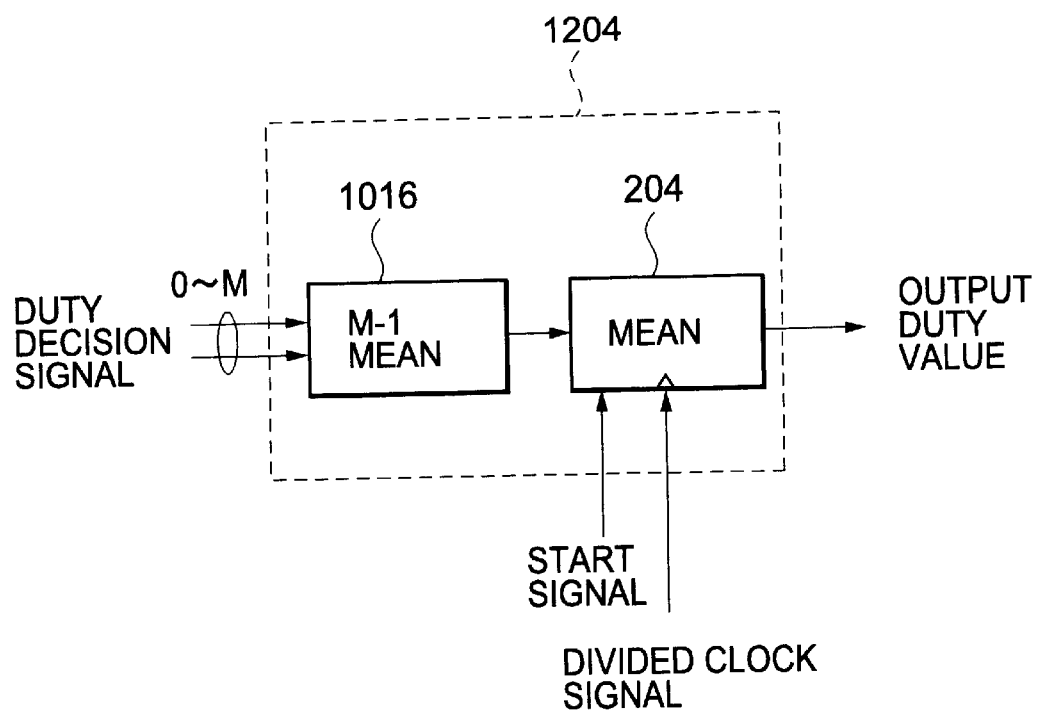
FIG. 12 is a schematic block diagram showing an M mean circuit included in the sixth embodiment.

FIG. 12 shows a specific configuration of the M mean 1204. As shown, the M mean 1204 is made up of the M−1 mean 1016 identical with the M−1 mean 1016 of FIG. 8 and the mean 204 identical with the mean 204 of FIG. 6. The weighting control, not shown, is capable of varying the weighting function f(X) by using the difference X and start signal. The difference is that the mean of the zero to M duty decision signals output from the M−1 mean 1016 is input to the mean 204 in place of the signal A.

The embodiments shown and described are not restrictive, but only illustrative. For example, the averaging section for producing a mean duty value has been shown and described as using Y=(½)X, Y=(1−4)X or similar linear function for the weighting purpose. Alternatively, use may be made of a linear function having any other suitable slope or even a nonlinear function, e.g., $Y=aX^2$ (a being any desired number) or $Y=aX^3$. Also, the period of time elapsed since the input of a start signal may be determined on the basis of, e.g., twenty bits or thirty bits instead of ten bits in matching relation to the characteristic of a system to which the circuitry of the present invention is applied.

Figure 22:
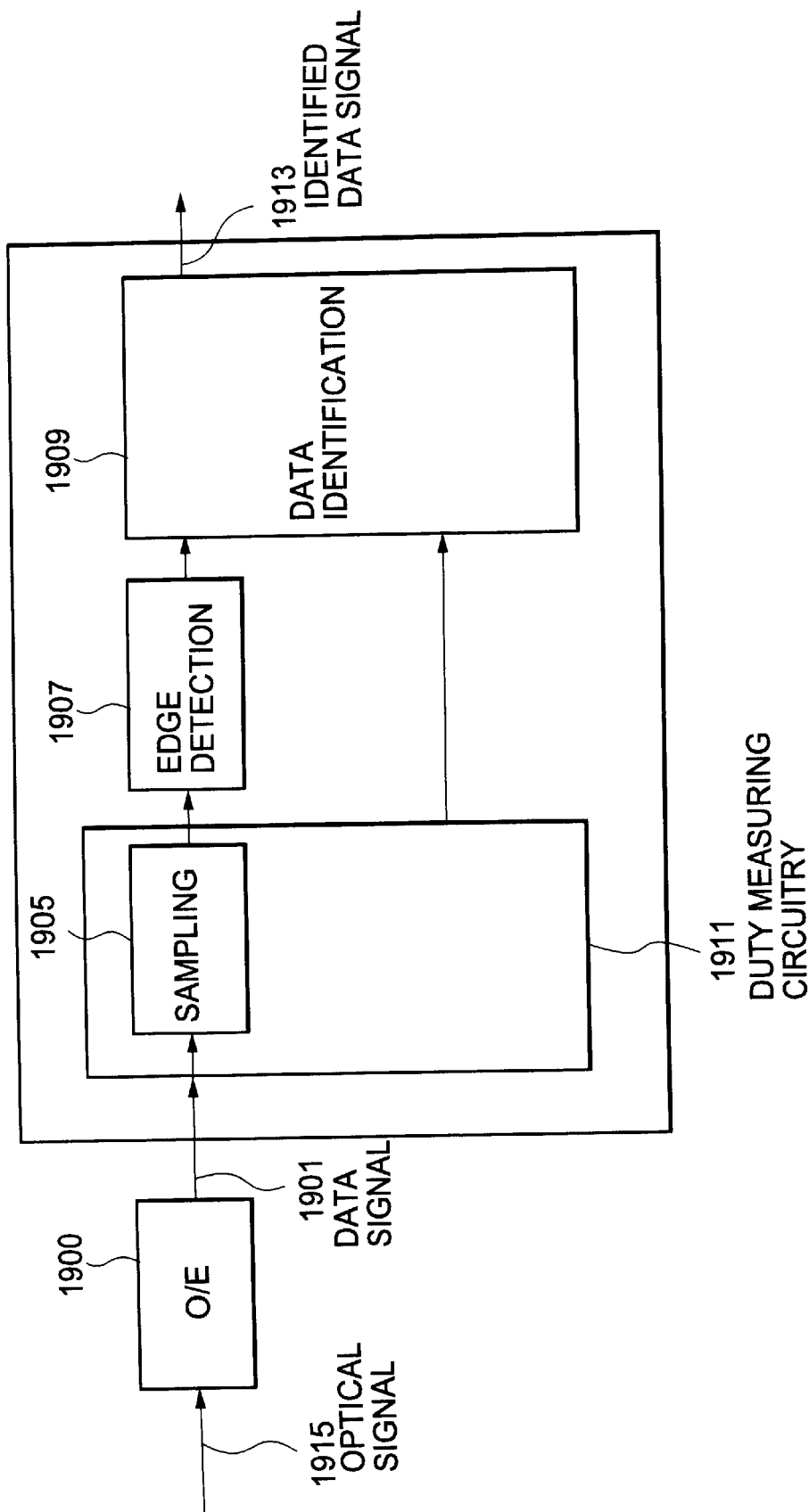
FIG. 22 is a block diagram schematically showing a data identification system including any one of the illustrative embodiments.

Reference will be made to FIG. 22 for describing a specific data identification system implemented by any one of the first to sixth embodiments shown and described. The system is constructed to identify data derived from an optical signal by way of example. As shown, the system includes an optoelectric conversion (O/E) 1900 for converting an optical signal 1915 to an electric data signal 1901. Duty measuring circuitry 1911 includes a sampling 1905 for sampling the data signal 1901 in the same manner as in any one of the first to sixth embodiments. An edge detection 1907 detects the edges of sampled signals output from the sampling 1905. A data identification 1909 receives the detected edges from the edge detection 1907 and receives duty values from the duty measuring circuitry 1911. The data identification 1909 identifies the data of the signals output from the edge detection 1907 on the basis of the duty values and outputs the resulting identified data signal 1913.

The duty of an optical signal is sometimes critically distorted, as discussed earlier. Therefore, should data be identified with no consideration given to the duty value, the result of identification would sometimes be erroneous. The system shown in FIG. 22 and including the duty measuring circuitry 1911 is capable of measuring the duty value of the input data signal rapidly without any error and identifying data by referencing the measured duty value. This is successful to reduce identification errors.

While the above system deals with an optical signal, the present invention is, of course, applicable to any other data identification system, which should involve a minimum of identification errors.

Figure 23A:
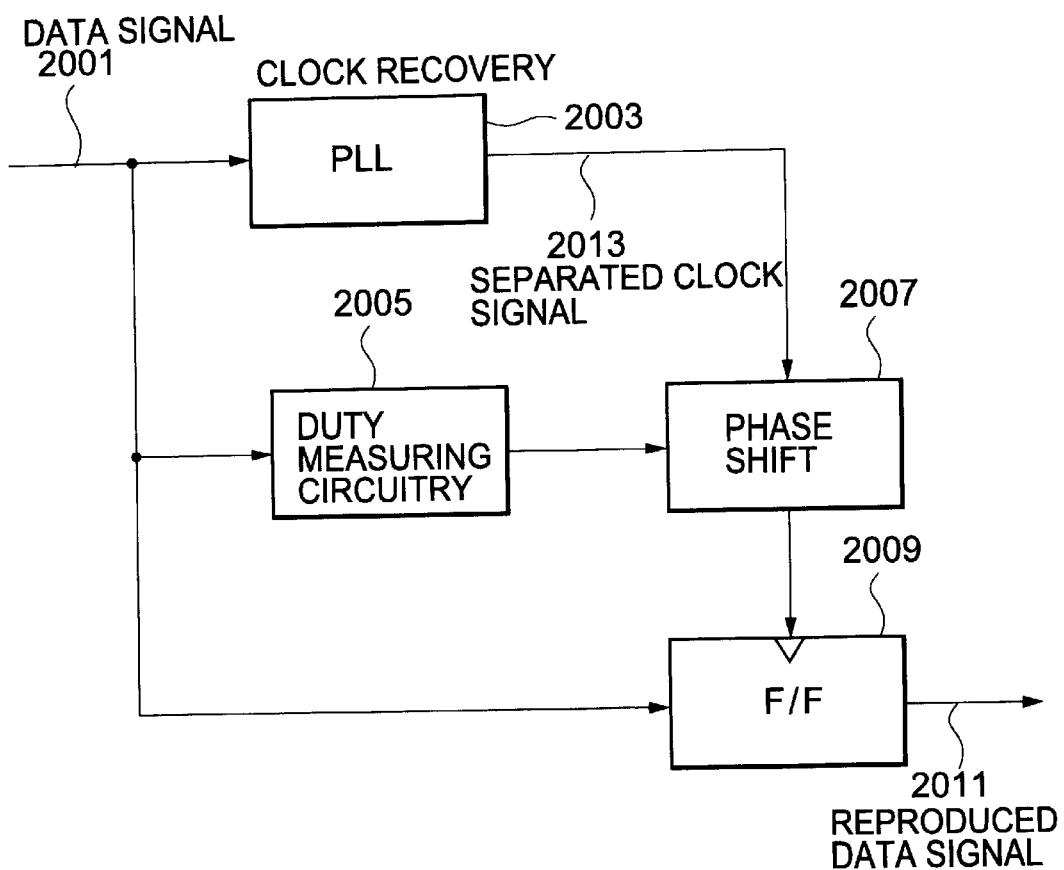
FIGS. 23A and 23B are a schematic block diagram showing a data reproduction system also including any one of the illustrative embodiments.

Referring to FIG. 23A, a data signal reproducing system to which any one of the first to sixth embodiments of the present invention is applied will be described. As shown, the data signal reproducing system includes a PLL or clock recovery section 2003. A data signal 2001 is input to the PLL 2003, duty measuring circuitry 2005, and a flip-flop (F/F). The PLL 2003 recovers a clock signal from the data signal 2001 and outputs a recovered clock signal 2013. The duty measuring circuitry 2005, implemented by any one of the first to sixth embodiments, measures a duty value of the data signal 2001 and outputs it. A phase shift 2007 determines, based on the duty value, an amount of phase shift of the recovered clock signal 2013 and outputs a clock signal shifted by the determined amount. The F/F 2009 again samples the data signal 2001 in synchronism with the clock signal output from the phase shift 2007 to thereby output a reproduced data signal 2011.

Figure 23B:
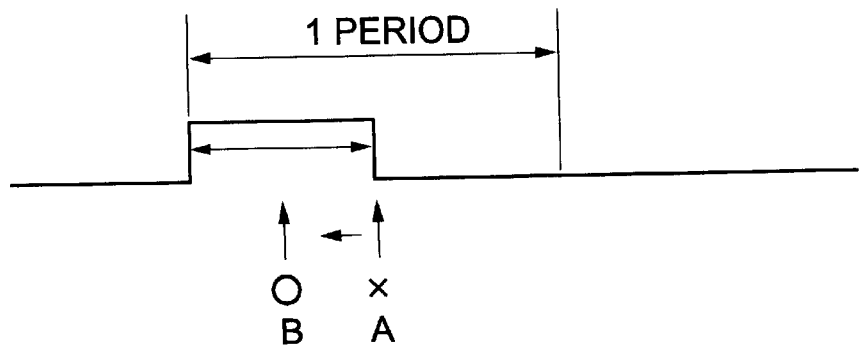

A specific operation of the above system will be described with reference to FIG. 23B. Assume that the duty measuring circuitry 2005 shown in FIG. 23A is absent. Then, as shown in FIG. 23B, it has been customary for the phase shift 2007 to shift the phase of the recovered clock signal 2013 such that the data signal 2001 is sampled at the intermediate point (point A) of one period. In practice, however, some data signals 2001 have duties distorted to a noticeable degree. Sampling such data signals 2001 at the point A would be defective.

In light of the above, the system shown in FIG. 23A, includes the duty measuring circuitry 2005 in accordance with the present invention. The circuitry 2005 allows the phase to be shifted by an amount matching with the distortion of the duty of the input data signal 2001, so that data can be accurately reproduced.

In summary, duty measuring circuitry of the present invention includes a pulse detecting circuit which does not directly take in detected concave and convex pulse widths as duty values and average them, but averages only information determined to have pulse widths smaller than a preselected limit by a duty decision circuit. The circuitry therefore selects only "101 (concave pulses)" and "010 (convex pulses)" out of an input data signal as duty values, i.e., does not erroneously select two-bit pulses including "1001" and "0110". It follows that duties can be measured without resorting to an exclusive field for a fixed pattern, e.g., "1" and "0" alternating with each other. In addition, the duty values of the input data signal can be accurately measured even with a random pattern based on RZ code or NRZ code.

Further, a mean circuit is capable of switching a weighting function in accordance with a phase difference. Specifically, when the difference is great, as expected just after the start-up of the circuitry or when a burst signal is received, the mean circuit selects a great weighting function. When the difference is small, as expected when the operation tracks steady slow changes to occur after tuning, the mean circuit selects a small weighting function. It is therefore possible to maintain rapid tuning (when the difference is great) and to strongly suppress jitter and other high-speed phase variation factors (when the difference is small). The mean circuit may vary the weighting function in accordance with a period of time elapsed since the input of a burst data signal.

A data identification system including the circuitry of the above duty measuring circuitry is capable of accurately measuring a duty value even when the duty of the input signal is distorted, and identifying data on the basis of the measured duty. Also, a data reproducing system including the circuitry of the present invention is capable of determining, when shifting a clock signal separated from the input signal, an amount of shift on the basis of a determined duty value so as to accurately reproducing the input signal.

Various modifications will become possible for those skilled in the art after receiving the teachings of the present disclosure without departing from the scope thereof.

What is claimed is:

1. Circuitry for measuring a duty of an input data signal, wherein at least one of a peak pulse width and a trough pulse width of the input data signal is detected and is determined, when smaller than a preselected value, to be valid for a calculation of a duty value, comprising:

sampling means for sampling the input data signal with either one of N-phase (N being any integer greater than 2 inclusive) clock signals which are N clock signals sequentially shifted in phase by 360°/N and identical in frequency with the input signal and an N-times clock signal N times higher in frequency than the input signal, wherein said sampling means produces N sampled signals by sampling the input data signal with said N-phase clock signal or said N-times clock signal, and sequentially shifts said N sampled signals by M−1 periods (M being any integer greater 1 inclusive) of said N-phase clock signals or by N(M−1) periods of said N-times clock signal to thereby output N×M sampled signals.

2. Circuitry as claimed in claim 1, further comprising pulse detecting means for detecting values of said N×M sampled signals in synchronism with a preselected clock signal and detecting, based on said values, at least one of M' peak pulse widths and M' trough pulse widths (M' being an integer smaller than or equal to M).

3. Circuitry as claimed in claim 2, wherein said preselected clock signal comprises a divided clock produced by dividing a clock signal input from outside of said circuitry by L (any integer greater than 1 inclusive), said circuitry further comprising frequency dividing means for dividing said clock signal input from the outside by L.

4. Circuitry as claimed in claim 2, further comprising duty decision means for calculating, when all of said M' trough pulse widths and peak pulse widths output from said pulse detecting means are smaller than a preselected pulse width, a valid duty value by using M" (positive integer smaller than or equal to M') of said M' trough pulse widths and peak pulse widths as valid pulse widths, wherein said duty decision means outputs, when M" is 1, said valid duty value as a first valid duty value or outputs, when M' is greater than 2 inclusive, a group of M" valid duty values as a group of second valid duty values.

5. Circuitry as claimed in claim 4, wherein said preselected pulse width is represented by a limit value input from the outside of said circuitry.

6. Circuitry as claimed in claim 4, further comprising M−1 mean averaging means for averaging said group of M" valid duty values output from said duty decision means, and outputting a resulting mean as a second duty value.

7. Circuitry as claimed in claim 4, further comprising averaging means for executing averaging including weighting with at least one of said first valid duty value and said second valid duty value.

8. Circuitry as claimed in claim 7, wherein said averaging means comprises:

memory means for storing a last duty value output previously as a mean value of at least one of said first valid duty values and said second valid duty values;

subtracting means for producing a difference X between the last duty value stored in said storing means and at least one of said first valid duty value and said second valid duty value;

weighting means for weighting the difference X to thereby produce a weighted value Y;

adding means for producing a sum Z of the weighted value Y and the duty value output previously as the mean value, and writing said sum Z in said storing means as the duty value to be output as the mean value; and weighting control means for controlling said weighting means.

9. Circuitry as claimed in claim 8, wherein said weighting control means controls said weighting means on the basis of the difference X.

10. Circuitry as claimed in claim 9, wherein said weighting control means causes said weighting means to convert the difference X to a corresponding phase difference and then convert the weighted value Y, which is given by at least one of functions Y=X, Y=(½)X, Y=(¼)X, Y=(⅛)X, Y=X+90°, Y=X −90°, Y=X+45°, Y=X+22.5°, Y=X−45°, Y=X−22.5°, Y=−90°, Y=90°, Y=−45° and Y=45°, to a corresponding duty value.

11. Circuitry as claimed in claim 9, wherein said weighting control means causes said weighting means to increase the weighted value Y when the difference X is great or reduce said weighted value when said difference X is small.

12. Circuitry as claimed in claim 11, wherein the weighted value is given by Y=(½)X when increased or given by Y=(¼)X when reduced.

13. Circuitry as claimed in claim 8, wherein said weighting control means controls said weighting means on the basis of a period of time elapsed since an input of a start signal.

14. Circuitry as claimed in claim 13, wherein the start signal is representative of a head of an input burst data signal.

15. Circuitry as claimed in claim 13, wherein said weighting control means causes said weighting means to increase the weighted value Y when the period of time is short or reduce said weighted value Y when said period of time is long.

16. Circuitry as claimed in claim 13, wherein said weighting control means causes said weighting means to output the weighted value Y given by Y=(½)X for ten bits since the input of the start signal or output said weighted value Y given by Y=(¼)X after said ten bits.

17. Circuitry as claimed in claim 8, wherein said weighting control means controls said weighting means on the basis of the difference X and a period of time elapsed since an input of a start signal.

18. Circuitry as claimed in claim 17, wherein the start signal is representative of a head of an input burst data signal.

19. Circuitry as claimed in claim 17, wherein said weighting control means causes said weighting means to convert the difference X to a corresponding phase difference and then convert the weighted value Y, which is given by at least one of functions Y=X, Y=(½)X, Y=(¼)X, Y=(⅛)X, Y=X+90°, Y=X−90°, Y=X+45°, Y=X+22.5°, Y=X−45°, Y=X−22.5°, Y=−90°, Y=90°, Y=−45° and Y=45°, to a corresponding duty value.

20. Circuitry as claimed in claim 17, wherein said weighting control means causes said weighting means to increase the weighted value Y when the difference X is great or reduce said weighted value when said difference X is small.

21. Circuitry as claimed in claim 17, wherein said weighting control means causes said weighting means to increase the weighted value Y when the period of time is short or reduce said weighted value Y when said period of time is long.

22. Circuitry as claimed in claim 17, wherein said weighting control means causes, based on the difference X and the period of time, said weighting means to provide a weight given by Y=X if said difference X is great over ten bits since the input of the start signal, provide a weight given by Y=(½)X if said difference X is small over said ten bits, provide a weight given by Y=(½)X if said difference X is great after said ten bits, or provide a weight given by Y=(¼)X if said difference X is small after said ten bits.

23. A data identification system comprising:
    circuitry as claimed in claim 1; and
    data identifying means for identifying, based on a duty output from said circuitry, data of the input data signal and outputting said data as an identified data signal.

24. A system as claimed in claim 23, further comprising edge detecting means for detecting edges of sampled signals output from said circuitry and feeding said edges to said data identifying means.

25. A system as claimed in claim 23, wherein the data signal comprises an electric signal produced by converting an optical signal, said system further comprising optoelectric converting means for converting said optical signal to said electric signal.

26. A system comprising:
    PLL means for separating a clock signal from the input data signal to thereby output a separated clock signal;
    said circuitry as claimed in claim 1;
    phase shifting means for shifting, based on the duty value output from said circuitry, a phase of the separated clock signal to thereby output a phase-shifted clock signal; and
    flip-flop means for sampling the input data signal in synchronism with said phase-shifted clock signal to thereby output a reproduced data signal.

27. A method of measuring a duty of an input data signal, comprising:
    a detecting step for detecting at least one of a peak pulse width and a trough pulse width;
    a validating step for validating, if the peak pulse width or the trough pulse width detected is smaller than a preselected value, said peak pulse width or said trough pulse width for a calculation of a duty value; and
    a sampling step for sampling the input signal with either one of N-phase (N being any integer greater than 2 inclusive) clock signals which are N clock signals sequentially shifted in phase by 360°/N and identical in frequency with the input signal and an N-times clock signal N times higher in frequency than the input signal, wherein said sampling step comprises producing N sampled signals by sampling the input signal with said N-phase clock signal or said N-times clock signal, and sequentially shifts said N sampled signals by M−1 periods (M being any integer greater than 1 inclusive) of said N-phase clock signals or by N(M−1) periods of said N-times clock signal to thereby output N×M sampled signals.

28. A method as claimed in claim 27, further comprising a pulse detecting step for detecting values of said N×M sampled signals in synchronism with a preselected clock signal and detecting, based on said values, at least one of M' peak pulse widths and M' trough pulse widths (M' being an integer smaller than or equal to M).

29. A method as claimed in claim 28, wherein said preselected clock signal comprises a divided clock produced by dividing a clock signal input from outside of said circuitry by L (any integer greater than 1 inclusive), said method further comprising a frequency dividing step for dividing said clock signal input from the outside by L.

30. A method as claimed in claim 28, further comprising a duty decision step for calculating, when all of said M' trough pulse widths and peak pulses widths output from said pulse detecting means are smaller than a preselected pulse width, a valid duty value by using M" (positive integer smaller than or equal to M') of said M' trough pulse widths and peak pulse widths as valid pulse widths, wherein said duty decision means outputs, when M' is 1, said valid duty value as a first valid duty value or outputs, when M" is greater than 2 inclusive, a group of M" valid duty values as a group of second valid duty values.

31. A method as claimed in claim 30, wherein said preselected pulse width is represented by a limit value input from the outside of said circuitry.

32. A method as claimed in claim 30, further comprising an M−1 averaging step for averaging said group of M" valid duty values output by said duty decision step, and outputting a resulting mean as a second duty value.

33. A method as claimed in claim 30, further comprising an averaging step for executing averaging including weighting with at least one of said first valid duty value and said second valid duty value.

34. A method as claimed in claim 33, wherein said averaging step comprises:
   a storing step for storing a duty value output previously as a mean value of at least one of said first valid duty values and said second valid duty values;
   a subtracting step for producing a difference X between the duty value stored in said storing step and at least one of said first valid duty value and said second valid duty value;
   a weighting step for weighting the difference X to thereby produce a weighted value Y;
   an adding step for producing a sum Z of the weighted value Y and the duty value output previously as the mean value, and storing said sum Z in said storing step as the duty value to be output as the mean value; and
   a controlling step for controlling said weighting step.

35. A method as claimed in claim 34, wherein said controlling step comprises controlling said weighting step on the basis of the difference X.

36. A method as claimed in claim 35, wherein said controlling step comprises causing said weighting step to convert the difference X to a corresponding phase difference and then convert the weighted value Y, which is given by at least one of functions Y=X, Y=(½)X, Y=(¼)X, Y=(⅛)X, Y=X+90°, Y=X−90°, Y=X+45°, Y=X+22.5°, Y=X−45°, Y=X−22.5°, Y=−90°, Y=90°, Y=−45° and Y=45°, to a corresponding duty value.

37. A method as claimed in claim 35, wherein said controlling step comprises causing said weighting step to increase the weighted value Y when the difference X is great or reduce said weighted value when said difference X is small.

38. A method as claimed in claim 37, wherein the weighted value Y is given by Y=(½)X when increased or given by Y=(¼)X when reduced.

39. A method as claimed in claim 34, wherein said controlling step comprises controlling said weighting step on the basis of a period of time elapsed since an input of a start signal.

40. A method as claimed in claim 39, wherein the start signal is representative of a head of an input burst data signal.

41. A method as claimed in claim 39, wherein said controlling step comprises causing said weighting step to increase the weighted value Y when the period of time is short or reduce said weighted value Y when said period of time is long.

42. A method as claimed in claim 39, wherein said controlling step comprises causing said weighting step to output the weighted value Y given by Y=(½)X for ten bits since the input of the start signal or output said weighted value Y given by Y=(¼)X after said ten bits.

43. A method as claimed in claim 34, wherein said controlling step comprises controlling said weighting step on the basis of the difference X and a period of time elapsed since an input of a start signal.

44. A method as claimed in claim 43, wherein the start signal is representative of a head of an input burst data signal.

45. A method as claimed in claim 43, wherein said controlling step comprises causing said weighting step to convert the difference X to a corresponding phase difference and then convert the weighted value Y, which is given by at least one of functions Y=X, Y=(½)X, Y=(¼)X, Y=(⅛)X, Y=X+90°, Y=X−90°, Y=X+45°, Y=X+22.5°, Y=X−45°, Y=X−22.5°, Y=−90°, Y=90°, Y=−45° and Y=45°, to a corresponding duty value.

46. A method as claimed in claim 43, wherein said controlling step comprises causing said weighting step to increase the weighted value Y when the difference X is great or reduce said weighted value when said difference X is small.

47. A method as claimed in claim 43, wherein said controlling step comprises causing said weighting step to increase the weighted value Y when the period of time is short or reduce said weighted value Y when said period of time is long.

48. A method as claimed in claim 43, wherein said controlling step comprises causing, based on the difference and the period of time, said weighting step to provide a weight given by Y=X if said difference X is great over ten bits since the input of the start signal, provide a weight given by Y=(½)X if said difference X is small over said ten bits, provide a weight given by Y=(½)X if said difference X is great after said ten bits, or provide a weight given by Y=(¼)X if said difference X is small after said ten bits.

49. A method of identifying data, comprising:
   a method of measuring a duty of an input data signal as claimed in claim 27; and
   a data identifying step for identifying, based on a duty output by said method of measuring a duty, data of the input data signal and outputting said data as an identified data signal.

50. A method as claimed in claim 49, further comprising an edge detecting step for detecting edges of sampled signals output by said method of measuring a duty of an input signal, and feeding said edges to said data identifying step.

51. A method as claimed in claim 49, wherein the data signal comprises an electric signal produced by converting an optical signal, said method further comprising a step of converting said optical signal to said electric signal.

52. A method of reproducing data, comprising:
   a PLL step for separating a clock signal from an input data signal to thereby output a separated clock signal;
   a method of measuring a duty of an input data signal as claimed in claim 27,
   a phase shifting step for shifting, based on the duty value output by said method of measuring a duty, a phase of the separated clock signal to thereby output a phase-shifted clock signal; and
   a flip-flop step for sampling the input data signal in synchronism with said phase-shifted clock signal to thereby output a reproduced data signal.

* * * * *